(12) United States Patent
Torii et al.

(10) Patent No.: US 12,261,027 B2
(45) Date of Patent: Mar. 25, 2025

(54) PLASMA PROCESSING APPARATUS AND PLASMA PROCESSING METHOD

(71) Applicant: Tokyo Electron Limited, Tokyo (JP)

(72) Inventors: Natsumi Torii, Miyagi (JP); Koichi Nagami, Miyagi (JP); Chishio Koshimizu, Miyagi (JP); Jun Abe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 17/945,353

(22) Filed: Sep. 15, 2022

(65) Prior Publication Data
US 2023/0078135 A1 Mar. 16, 2023

(30) Foreign Application Priority Data

Sep. 15, 2021 (JP) .................................. 2021-150027
Aug. 26, 2022 (JP) .................................. 2022-134831

(51) Int. Cl.
*H01J 37/32* (2006.01)
(52) U.S. Cl.
CPC .. *H01J 37/32642* (2013.01); *H01J 37/32128* (2013.01); *H01J 37/32174* (2013.01); *H01J 37/32697* (2013.01); *H01J 2237/24564* (2013.01); *H01J 2237/24585* (2013.01)
(58) Field of Classification Search
None
See application file for complete search history.

(56) References Cited

U.S. PATENT DOCUMENTS

| | | | | |
|---|---|---|---|---|
| 11,201,034 B2* | 12/2021 | Hisatomi | .......... | H01J 37/32009 |
| 11,437,223 B2* | 9/2022 | Sasaki | ............... | H01L 21/68721 |
| 11,742,183 B2* | 8/2023 | Hisatomi | .......... | H01J 37/32146 |
| | | | | 315/111.21 |
| 11,908,666 B2* | 2/2024 | Sasaki | ................. | H01J 37/3255 |
| 2008/0099326 A1* | 5/2008 | Ye | .......................... | C23C 14/541 |
| | | | | 204/192.15 |
| 2020/0118794 A1* | 4/2020 | Koshimizu | ....... | H01J 37/32027 |
| 2020/0194239 A1* | 6/2020 | Sasaki | ............... | H01L 21/68735 |
| 2020/0211823 A1* | 7/2020 | Hisatomi | .......... | H01J 37/32183 |
| 2020/0273670 A1* | 8/2020 | Koshimizu | ............. | H01J 37/04 |
| 2020/0402777 A1* | 12/2020 | Sasaki | ............... | H01J 37/32642 |

(Continued)

FOREIGN PATENT DOCUMENTS

| | | | | |
|---|---|---|---|---|
| JP | 2008-227063 A | | 9/2008 | |
| WO | WO-2023013506 A1 * | | 2/2023 | .......... H01J 37/3244 |
| WO | WO-2023013507 A1 * | | 2/2023 | ............... H01J 37/32 |

*Primary Examiner* — Srinivas Sathiraju
(74) *Attorney, Agent, or Firm* — XSENSUS LLP

(57) ABSTRACT

There is provided a plasma processing apparatus for performing plasma processing or a substrate, comprising: a chamber; a substrate support disposed in the chamber and including a base, an electrostatic chuck on the base, and an edge ring disposed to surround a substrate mounted on the electrostatic chuck; a Radio Frequency (RF) power supply for supplying RF power for generating plasma from gases in the chamber; a DC power supply for applying a negative DC voltage to the edge ring; a waveform control element for controlling a waveform of the DC voltage; and a controller for controlling a time taken for the DC voltage to reach a desired value by adjusting a constant of the waveform control element.

19 Claims, 13 Drawing Sheets

(56) References Cited

U.S. PATENT DOCUMENTS

| | | |
|---|---|---|
| 2020/0411286 A1* | 12/2020 | Koshimizu ....... H01J 37/32532 |
| 2021/0327681 A1* | 10/2021 | Koshimizu ....... H01J 37/32165 |
| 2021/0335645 A1* | 10/2021 | Ueda ................. H01L 21/6833 |
| 2021/0358717 A1* | 11/2021 | Kim .................. H01J 37/32706 |
| 2022/0013338 A1* | 1/2022 | Ishida ............... H01J 37/32568 |
| 2022/0020576 A1* | 1/2022 | Torii ................. H01J 37/32715 |
| 2022/0037121 A1* | 2/2022 | Dorf ................. H01L 21/31116 |
| 2022/0076921 A1* | 3/2022 | Hisatomi .......... H01J 37/32009 |
| 2022/0108879 A1* | 4/2022 | Ueda ................. H01J 37/32724 |
| 2022/0122813 A1* | 4/2022 | Bin Budiman ... H01J 37/32926 |
| 2022/0130651 A1* | 4/2022 | Amikura ................. B25J 19/02 |
| 2022/0384155 A1* | 12/2022 | Sasaki ................. H01J 37/3255 |
| 2022/0415628 A1* | 12/2022 | Ezaki ................ H01J 37/32642 |
| 2022/0415629 A1* | 12/2022 | Koiwa .............. H01J 37/32091 |
| 2023/0078135 A1* | 3/2023 | Torii ................. H01J 37/32697 |
| | | 315/111.21 |
| 2024/0030014 A1* | 1/2024 | Shimizu ............. H01J 37/3299 |
| 2024/0153749 A1* | 5/2024 | Sasaki ............... H01J 37/32091 |

* cited by examiner

PLASMA PROCESSING APPARATUS AND PLASMA PROCESSING METHOD

CROSS-REFERENCE TO RELATED APPLICATIONS

This application claims priority to Japanese Patent Application Nos. 2021-150027 filed on Sep. 15, 2021 and 2022-134831 filed on Aug. 26, 2022, the entire contents of each are incorporated herein by reference.

TECHNICAL FIELD

The present disclosure relates to a plasma processing apparatus and a plasma processing method.

BACKGROUND

Patent Document 1 discloses a plasma processing apparatus that includes a mounting table on which a wafer is mounted, disposed in a chamber, and an edge ring disposed on the mounting table to surround the wafer, and performs plasma processing on the wafer. In this plasma processing apparatus, distortion of a sheath is eliminated, and ions are vertically incident on the front surface of the wafer by applying a negative DC voltage to the edge ring consumed by plasma.

SUMMARY

Technology according to the present disclosure improves at least one of controllability of a tilt angle in the edge region of a substrate in plasma processing and abnormal discharge between the substrate and an edge ring.

In accordance with an aspect of the present disclosure, there is provided a plasma processing apparatus for performing plasma processing on a substrate, comprising: a chamber; a substrate support disposed in the chamber and including a base, an electrostatic chuck on the base, and an edge ring disposed to surround a substrate mounted on the electrostatic chuck; a Radio Frequency (RF) power supply for supplying RF power for generating plasma from gases in the chamber; a DC power supply for applying a negative DC voltage to the edge ring; a waveform control element for controlling a waveform of the DC voltage; and a controller for controlling a time taken for the DC voltage to reach a desired value by adjusting a constant of the waveform control element.

DETAILED DESCRIPTION

Figure 1:
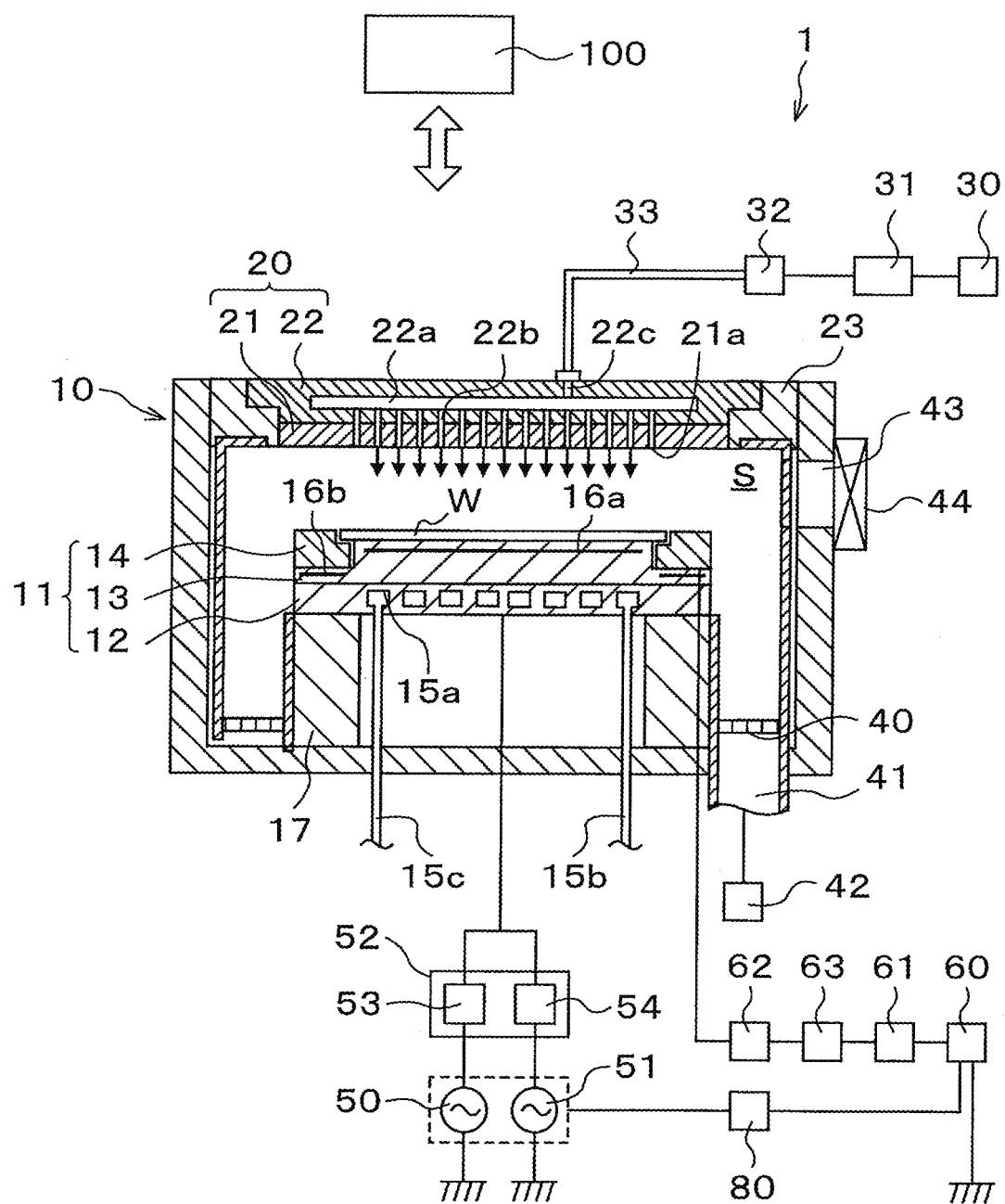
FIG. 1 is a longitudinal sectional view schematically showing a configuration of a plasma processing apparatus according to the present embodiment.

In a semiconductor device manufacturing process, plasma processing is performed on a semiconductor wafer (hereinafter referred to as a "wafer"). In plasma processing, plasma is generated by exciting a processing gas, and a wafer is processed by the plasma.

Plasma processing is performed in a plasma processing apparatus. The plasma processing apparatus generally includes a chamber, a stage, and a radio frequency (RF) power supply. In one example, the RF power supply includes a first RF power supply and a second RF power supply. The first RF power supply supplies first RF power to generate plasma of gases in the chamber. The second RF power supply supplies second RF power for bias to a lower electrode in order to attract ions to the wafer. Plasma is generated in the chamber. The stage is provided in the chamber. The stage includes the lower electrode and an electrostatic chuck. In one example, an edge ring is disposed on the electrostatic chuck to surround a wafer mounted on the electrostatic chuck. The edge ring is provided in order to improve the uniformity of plasma processing on a wafer.

The edge ring abrades over time during which plasma treatment is performed, and thus the thickness of the edge ring is reduced. When the thickness of the edge ring is reduced, the shape of a sheath changes above the edge ring and the edge region of the wafer. When the shape of the sheath changes in this way, an ion incident direction in the edge region of the wafer is inclined with respect to the vertical direction. As a result, a concave portion formed in the edge region of the wafer is inclined with respect to the thickness direction of the wafer.

In order to form a concave portion extending in the thickness direction of the wafer in the edge region of the wafer, the shape of the sheath above the edge ring and the edge region of the wafer needs to be controlled to adjust the ion incident direction to the edge region of the wafer. Therefore, in order to control the shape of the sheath over the edge ring and the edge region of the wafer, for example, Patent Document 1 proposes a plasma processing apparatus configured to apply a negative DC voltage to the edge ring from a DC power supply.

However, in the conventional plasma processing apparatus, one or both of the first RF power and the second RF power are supplied in a pulse shape in some cases. In such plasma processing, discharge may occur due to a potential difference between the wafer and the edge ring. For this reason, the plasma processing apparatus may apply a DC voltage to the edge ring in synchronization with the RF power supplied in a pulse shape.

However, when RF power is supplied in a pulse shape, bias does not immediately occur due to the influence of reflection (reflected power) of the RF power. Accordingly, even if the DC voltage is applied to the edge ring in synchronization with the RF power, a potential difference is generated between the wafer and the edge ring, and thus the risk of generating discharge may not be sufficiently reduced. As a result, the wafer may be damaged.

Technology according to the present disclosure curbs discharge between a substrate and an edge ring. Hereinafter, a plasma processing apparatus and a plasma processing method according to the present embodiment will be described with reference to the drawings. In this specification and drawings, elements which have substantially the same functional configuration are denoted by the same reference numeral and redundant description is omitted.

<Plasma Processing Device>

Figure 2:
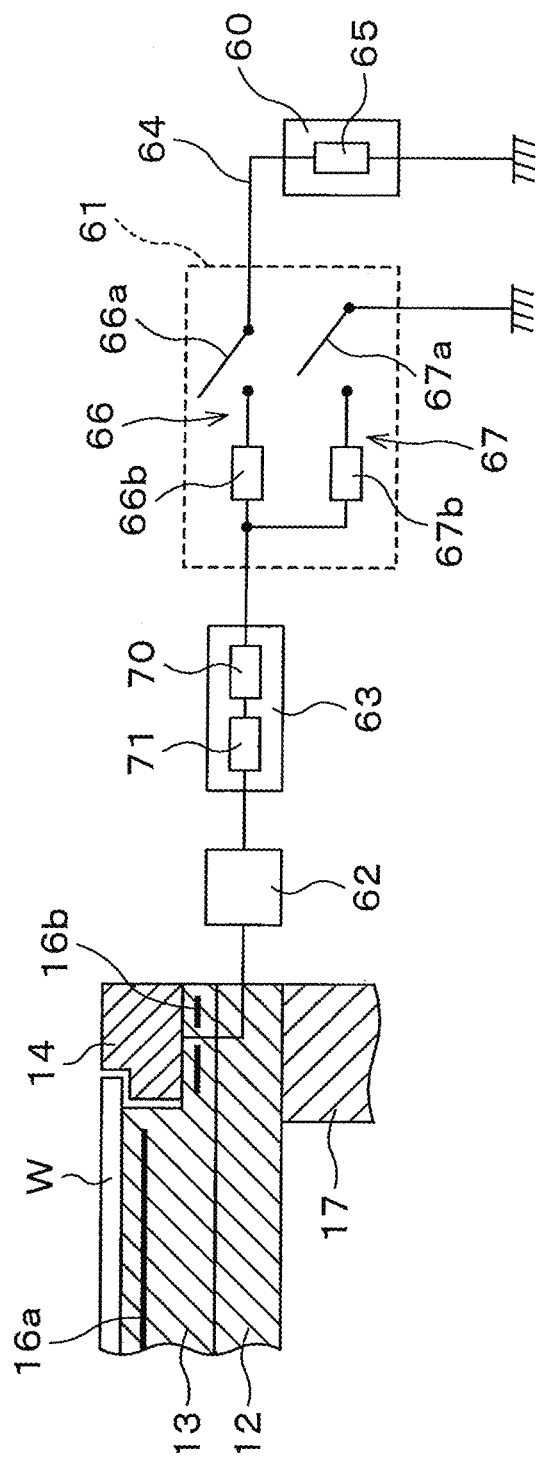
FIG. 2 is an explanatory diagram of a power supply system of the plasma processing apparatus according to the present embodiment.

First, the plasma processing apparatus according to the present embodiment will be described. FIG. 1 is a longitudinal sectional view schematically showing the configuration of the plasma processing apparatus 1. FIG. 2 is an explanatory diagram of a power supply system for applying a DC voltage to an edge ring 14. The plasma processing apparatus 1 is a capacitively coupled plasma processing apparatus. In the plasma processing apparatus 1 performs plasma processing on a wafer W as a substrate. Although plasma processing is not particularly limited, an etching process, a film-forming process, a diffusion process, and the like are performed as plasma processing.

As shown in FIG. 1, the plasma processing apparatus 1 has a chamber 10 having a substantially cylindrical shape. A processing space S in which plasma is generated is partitioned inside the chamber 10. The chamber 10 is made of, for example, aluminum. The chamber 10 is connected to the ground potential.

A stage 11 as a substrate support on which the wafer W is mounted is provided in the chamber 10. The stage 11 has a lower electrode 12, an electrostatic chuck 13, and the edge ring 14. The lower electrode is an example of a base. In addition, an electrode plate (not shown) made of, for example, aluminum may be provided on the lower surface side of the lower electrode 12.

The lower electrode 12 is made of a conductive material, for example, a metal such as aluminum, and has a substantially disk shape.

Further, the stage 11 may include a temperature control module configured to adjust at least one of the electrostatic chuck 13, the edge ring 14, and the wafer W to a desired temperature. The temperature control module may include a heater, a flow path, or a combination thereof. A temperature control medium such as a refrigerant and a heat transfer gas flows through the flow path.

In one example, a flow path 15a is formed in the lower electrode 12. The temperature control medium is supplied to the flow path 15a from a chiller unit (not shown) provided outside the chamber 10 through an inlet pipe 15b. The temperature control medium supplied to the flow path 15a is returned to the chiller unit through an outlet flow path 15c. By circulating the temperature control medium, for example, a coolant such as cooling water, in the flow path 15a, the electrostatic chuck 13, the edge ring 14, and the wafer W can be cooled to a desired temperature.

The electrostatic chuck 13 is provided on the lower electrode 12. In one example, the electrostatic chuck 13 is a member configured to be capable of holding both the wafer W and the edge ring 14 by electrostatic force. In the electrostatic chuck 13, the upper surface of the central portion is higher than the upper surface of the peripheral portion. The upper surface of the central portion of the electrostatic chuck 13 serves as a wafer mounting surface on which the wafer W is mounted, and in one example, the upper surface of the peripheral portion of the electrostatic chuck 13 serves as an edge ring mounting surface on which the edge ring 14 is mounted.

In one example, a first electrode 16a for sucking and holding the wafer W is provided in the central portion of the electrostatic chuck 13. A second electrode 16b for sucking and holding the edge ring 14 is provided on the periphery of the inside of the electrostatic chuck 13. The electrostatic chuck 13 has a configuration in which the electrodes 16a and 16b are sandwiched between insulators made of an insulating material.

A DC voltage from a DC power supply (not shown) is applied to the first electrode 16a. By the electrostatic force caused thereby, the wafer W is adsorbed and held on the upper surface of the central portion of the electrostatic chuck 13. Similarly, the DC voltage from the DC power supply (not shown) is applied to the second electrode 16b. In one example, the edge ring 14 is adsorbed and held on the upper surface of the peripheral portion of the electrostatic chuck 13 by the electrostatic force caused by the applied DC voltage.

Although the central portion of the electrostatic chuck 13 at which the first electrode 16a is provided and the peripheral portion thereof on which the second electrode 16b is provided are integrated in the present embodiment, the central portion and the peripheral portion may be separate. In addition, both the first electrode 16a and the second electrode 16b may be a single pole or double pole.

Although the edge ring 14 is electrostatically attracted to the electrostatic chuck 13 by applying a DC voltage to the second electrode 16b in the present embodiment, the method of holding the edge ring 14 is not limited thereto. For example, the edge ring 14 may be attached and held using an adsorption sheet, and the edge ring 14 may be clamped to be held. Alternatively, the edge ring 14 may be held by its weight.

The edge ring 14 is an annular member disposed to surround the wafer W mounted on the upper surface of the central portion of the electrostatic chuck 13. The edge ring 14 is provided in order to improve the uniformity of plasma processing. To this end, the edge ring 14 is made of a material appropriately selected according to plasma treatment, has conductivity, and may be made of, for example, Si or SiC.

The stage 11 configured as described above is fastened to a support member 17 having a substantially cylindrical shape provided at the bottom of the chamber 10. The support member 17 is made of, for example, an insulator such as ceramic or quartz.

A shower head 20 is provided to face the stage 11 above the stage 11. The shower head 20 includes an electrode plate 21 disposed to face the processing space S, and an electrode support 22 provided above the electrode plate 21. The electrode plate 21 serves as an upper electrode to make a pair with the lower electrode 12. As will be described later, the shower head 20 is connected to the ground potential only when a first RF power supply 50 is electrically coupled to the lower electrode 12. In addition, the shower head 20 is supported on the upper part (ceiling surface) of the chamber 10 via an insulating shielding member 23.

A plurality of gas outlets 21a for supplying a processing gas sent from a gas diffusion chamber 22a which will be described later to the processing space S is formed in the electrode plate 21. The electrode plate 21 is made of, for example, a conductor or a semiconductor having low electrical resistivity in which little Joule heat is generated.

The electrode support 22 supports the electrode plate 21 in a detachable manner. The electrode support 22 has a structure in which a film having plasma resistance is formed on the surface of a conductive material such as aluminum, for example. This film may be a film formed by anodizing, or a film made of ceramics such as yttrium oxide. The gas diffusion chamber 22a is formed inside the electrode support 22. A plurality of gas distribution holes 22b communicating with the gas outlets 21a are formed from the gas diffusion chamber 22a. Moreover, a gas introduction hole 22c connected to a gas supply pipe 33 mentioned later is formed in the gas diffusion chamber 22a.

In addition, a gas supply source group 30 for supplying processing gases to the gas diffusion chamber 22a is connected to the electrode support 22 through a flow control device group 31, a valve group 32, the gas supply pipe 33, and the gas introduction hole 22c.

The gas supply source group 30 includes a plurality of types of gas supply sources necessary for plasma processing. The flow control device group 31 includes a plurality of flow controllers, and the valve group 32 includes a plurality of valves. Each of the plurality of flow controllers in the flow control device group 31 is a mass flow controller or a pressure control type flow controller. In the plasma processing apparatus 1, processing gases from one or more gas supply sources selected from the gas supply source group 30 are supplied to the gas diffusion chamber 22a through the flow control device group 31, the valve group 32, the gas supply pipe 33, and the gas introduction hole 22c. Then, the processing gases supplied to the gas diffusion chamber 22a are dispersed and supplied in the form of shower into the processing space S through the gas distribution holes 22b and the gas outlets 21a.

A baffle plate 40 is provided between the inner wall of the chamber 10 and the support member 17 as the bottom of the chamber 10. The baffle plate 40 is formed by, for example, coating an aluminum material with ceramics such as yttrium oxide. A plurality of through holes are formed in the baffle plate 40. The processing space S communicates with an exhaust port 41 through the baffle plate 40. An exhaust device 42 such as a vacuum pump is connected to the exhaust port 41 and configured to allow the pressure in the processing space S to be reduced.

In addition, a carry-in outlet 43 for wafer W is formed on the side wall of the chamber 10, and the carry-in outlet 43 can be opened and closed by a gate valve 44.

The plasma processing apparatus 1 further includes the first RF power supply 50, a second RF power supply 51, and a matching device 52. The first RF power supply 50 and the second RF power supply 51 are coupled to the lower electrode 12 through the matching device 52. In addition, the first RF power supply 50 and the second RF power supply 51 constitute an RF power supply in the present disclosure.

The first RF power supply 50 generates RF power HF for plasma generation and supplies the RF power HF to the lower electrode 12. The RF power HF may be any frequency within the range of 27 MHz to 100 MHz, and in one example, it is 40 MHz. The first RF power supply 50 is coupled to the lower electrode 12 through the first matching circuit 53 of the matching device 52. The first matching circuit 53 is a circuit for matching the output impedance of the first RF power supply 50 with the input impedance of a load side (lower electrode 12). In addition, the first RF power supply 50 may not be electrically coupled to the lower electrode 12 and may be coupled to the shower head 20 serving as the upper electrode through the first matching circuit 53. Instead of the first RF power supply 50, a pulse power supply configured to apply a pulse voltage other than the RF power to the lower electrode 12 may be used. This pulse power supply is the same as a pulse power supply used in place of the second RF power supply 51 which will be described later.

The second RF power supply 51 generates RF power (RF bias power) LF for attracting ions to the wafer W and supplies the RF power LF to the lower electrode 12. The RF power LF may be a frequency within the range of 400 kHz to 13.56 MHz, and in an example, the RF power LF is 400 kHz. The second RF power supply 51 is coupled to the lower electrode 12 via a second matching circuit 54 of the matching device 52. The second matching circuit 54 is a circuit for matching the output impedance of the second RF power supply 51 with the input impedance of the load side (lower electrode 12). Instead of the second RF power supply 51, a pulse power supply configured to apply a pulse voltage other than the RF power to the lower electrode 12 may be used. Here, the pulse voltage is a pulse-shaped voltage having a periodically changing magnitude. The pulse power supply may be a DC power supply. The pulse power supply itself may be configured to apply a pulse voltage or may be configured to include a device for pulsing the voltage on the downstream side. In one example, a pulse voltage is applied to the lower electrode 12 such that a negative potential is generated in the wafer W. The pulse voltage may be a square wave, a triangular wave, an impulse, or may have other waveforms. The frequency (pulse frequency) of the pulse voltage may be in the range of 100 kHz to 2 MHz. The RF power LF or the pulse voltage (hereinafter, both are collectively referred to as "bias power") may be supplied or applied to a bias electrode provided inside the electrostatic chuck 13. In addition, the pulse power supply is not limited to a power supply for power control and may be used as a power supply for voltage constant control. In this case, RF power RF which will be described later and a RF voltage of a constant voltage control power supply have the same meaning. The bias electrode may include a first bias electrode provided in a region (first region) corresponding to the wafer mounting surface, and a second bias electrode provided in a region (second region) corresponding to the edge ring mounting surface. In this case, bias power (first bias power) applied or supplied to the first bias electrode and bias power (second bias power) applied or supplied to the second bias electrode may be independently controlled.

In addition, in the following description, a state in which one or both of the RF power HF from the first RF power supply 50 and the RF power LF from the second RF power supply 51 are supplied to the lower electrode 12 is referred to as "RF ON" in some cases. A state in which neither the RF power HF nor the RF power LF is supplied to the lower electrode 12 may be called "RF OFF." The RF power HF and the RF power LF may be collectively referred to as "RF power RF."

As shown in FIGS. 1 and 2, the plasma processing apparatus 1 further includes a direct current (DC) power supply 60, a switching unit 61, a first RF filter 62, and a second RF filter 63. The DC power supply 60 is electrically connected to the edge ring 14 via a path 64. In the path 64, the switching unit 61, the second RF filter 63, and the first RF filter 62 are provided in this order from the DC power supply 60. Although the two RF filters 62 and 63 were provided with respect to the DC power supply 60 in the present embodiment, the number of RF filters is not limited thereto and may be one, for example.

In addition, although the DC power supply 60 is connected to the edge ring 14 via the switching unit 61, the first RF filter 62, and the second RF filter 63 in the present embodiment, the power supply system for applying a DC voltage to the edge ring 14 is not limited thereto. For example, the DC power supply 60 may be electrically connected to the edge ring 14 via the switching unit 61, the second RF filter 63, the first RF filter 62, and the lower electrode 12.

The DC power supply 60 is a power supply for generating a negative DC voltage DC applied to the edge ring 14. The DC power supply 60 is a variable DC power supply and can adjust the level of a DC voltage DC. A pulse generator 65 for generating pulses of a DC voltage DC is provided inside the DC power supply 60. The pulse generator 65 applies a DC voltage DC in a pulse form on the basis of a pulse signal from a pulse signal source 80 which will be described later. In addition, the pulse generator 65 may be disposed downstream of the DC power supply 60 as a device independent of the DC power supply 60.

The switching unit 61 is configured to be able to stop application of the DC voltage DC from the DC power supply 60 to the edge ring 14. Specifically, the switching unit 61 switches between a connection of the edge ring 14 and a DC power supply circuit 66 and a connection of the edge ring 14 and a static elimination circuit 67. When the DC power supply 60 is a power supply having two or more DC voltage outputs, for example, a static elimination circuit may be included therein. For example, to change the output of the first DC voltage DC to the output of the second DC voltage DC when the output of the first DC voltage DC is greater than the output of the second DC voltage DC, the first DC voltage DC is output and discharged until the first DC voltage DC becomes equal to the second DC voltage DC, and then the second DC voltage DC is output. Therefore, a static elimination circuit for eliminating a potential difference at the time of switching between two DC voltage outputs may be provided inside or outside the DC power supply 60 depending on the number of power output outputs. This static elimination circuit may also be used as the static elimination circuit 67.

The DC power supply circuit 66 is connected to the DC power supply 60 and applies a DC voltage DC from the DC power supply 60 to the edge ring 14. In one example, the DC power supply circuit 66 includes a switching element 66a and a dumping element 66b. As the switching element 66a, a field effect transistor (FET) is used, for example. However, as the switching element 66a, an insulated gate type bipolar transistor (IGBT) or a relay other than FET may be used. In a state in which the switching element 66a is closed (on state), the edge ring 14 and the DC power supply 60 are connected and thus the DC voltage DC is applied to the edge ring 14. On the other hand, in a state in which the switching element 66a is opened (off state), the DC voltage DC is not applied to the edge ring 14. In the following description, a state in which the switching element 66a is turned on may be referred to as "DC ON" and a state in which the switching element 66a is turned off may be referred to as "DC OFF." The dumping element 66b is, for example, a resistor or a coil, and the value and position thereof can be freely determined by a designer.

The static elimination circuit 67 is a circuit for discharging the edge ring 14. In one example, the static elimination circuit 67 includes a switching element 67a and a dumping element 67b. As the switching element 67a, a field effect transistor (FET) is used, for example. However, as the switching element 67a, an insulated gate type bipolar transistor (IGBT) or a relay other than FET may be used. In a state in which the switching element 67a is closed (on state), the edge ring 14 and the static elimination circuit 67 are connected and thus the electric charge of the edge ring 14 flows into the static elimination circuit 67 and thus static elimination occurs in the edge ring 14 (14). On the other hand, in a state in which switching element 67a is opened (off state), static elimination does not occur in the edge ring 14. In the following description, a state in which the switching element 67a is turned on may be referred to as "static elimination on" and a state in which the switching element 67a is turned off may be referred to as "static elimination off." The dumping element 67b is, for example, a resistor or a coil, and the value and position thereof can be freely determined by a designer.

The first RF filter 62 and the second RF filter 63 are provided to attenuate RF power to protect the DC power supply 60. The first RF filter 62 attenuates, for example, 40 MHz RF power from the first RF power supply 50. The second RF filter 63 attenuates a 400 kHz RF power from the second RF power supply 51, for example.

The second RF filter 63 includes a waveform control element 70 and a non-waveform control element 71. The waveform control element 70 is an element that controls the waveform of the DC voltage DC. The non-waveform control element 71 is an element having functions other than the function of controlling the waveform of the DC voltage DC, and for example, a variable element for varying the impedance of the second RF filter 63 as will be described later. Alternatively, the non-waveform control element 71 may be, for example, any one of a capacitive element, an inductive element, a resistive element, a general element having an equivalent function thereto, an electromagnetic energy converter, and a transmission line, a combination thereof, or all thereof. In addition, although the waveform control element 70 and the non-waveform control element 71 are provided in this order from the DC power supply 60 in the example of FIG. 2, the arrangement order may be reversed. The arrangement order of the waveform control element 70 and the non-waveform control elements 71 can be appropriately designed by those skilled in the art.

Figure 3A:
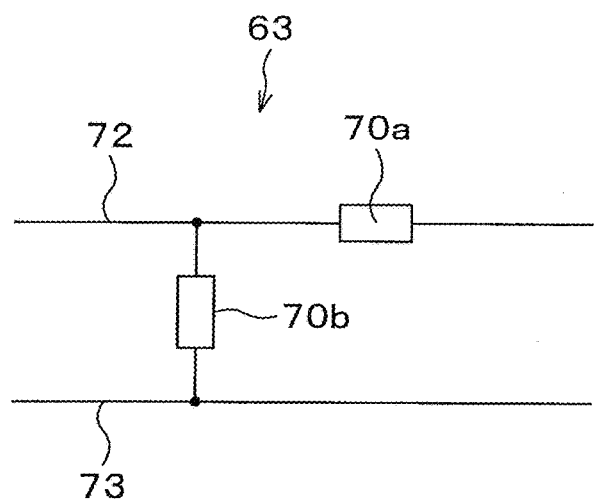
FIG. 3A is explanatory drawing showing an example of an internal configuration of a second RF filter.

FIG. 3A to FIG. 3D are explanatory diagrams showing an example of the internal configuration of the second RF filter 63. As shown in FIG. 3A, a hot-side path 72 and a return-side path 73 are provided inside the second RF filter 63. The hot-side path 72 is, for example, the path 64 connecting the DC power supply 60 and the edge ring 14. The return-side path 73 is, for example, a housing, a shield wire, an earth wire, or the like connected to the ground.

Figure 3B:
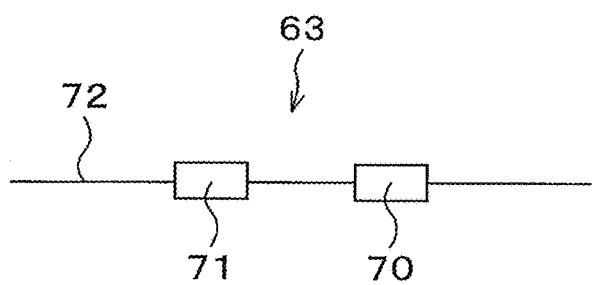
FIG. 3B is explanatory drawing showing an example of the internal configuration of the second RF filter.
Figure 3C:
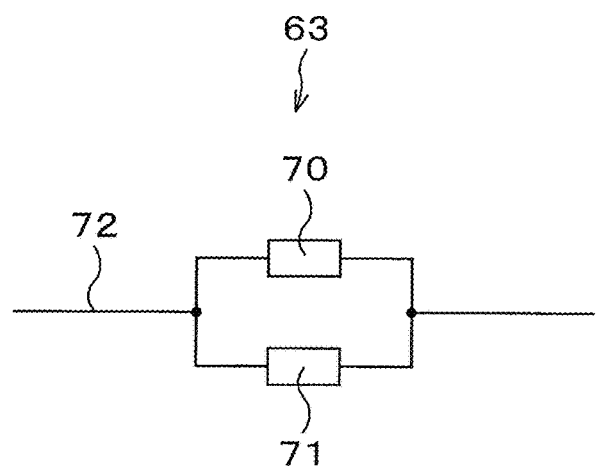
FIG. 3C is explanatory drawing showing an example of the internal configuration of the second RF filter.

The waveform control element 70 may be any of a capacitive element (waveform control element 70b), an inductive element (waveform control element 70a), a resistive element (waveform control element 70b), a general element having a function equivalent thereto, an electromagnetic energy converter, and a transmission line. Further, the waveform control element 70 may be a combination of a plurality of capacitive elements, inductive elements, resistive elements, electromagnetic energy converters, and transmission lines, or may be constituted by all of these elements. In addition, the waveform control element 70 may be provided in series with the non-waveform control element 71 on the hot-side path 72, for example, as shown in FIG. 3B, or provided in parallel with the non-waveform control element 71 on the hot-side path 72, for example, as shown in FIG. 3C. In this manner, the number and arrangement of waveform control elements 70 can be appropriately designed by those skilled in the art.

Figure 3D:
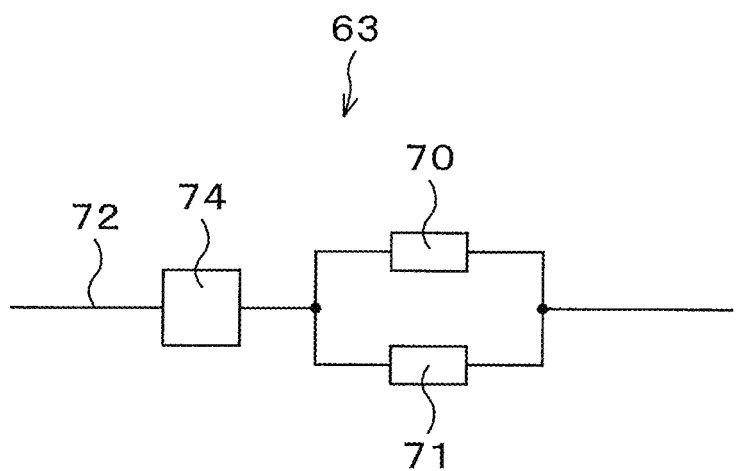
FIG. 3D is explanatory drawing showing an example of the internal configuration of the second RF filter.

The constant of the waveform control element 70 is changeable. In this case, the waveform control element 70 may be either a coil (inductor) or a capacitor (capacitor), for example. Further, the waveform control element 70 is not limited to a coil and a capacitor and may be any element (e.g., a diode or the like) having a constant variable by a voltage or current and capable of achieving the same function. Since the constant of the waveform control element 70 is variable, the waveform of the DC voltage DC can be controlled by adjusting the constant of the waveform control element 70 as will be described later. Further, the constant of the waveform control element 70 does not need to be variable, and as shown in FIG. 3D, a combination of waveform control elements 70 having fixed constant values may be switched using a switching circuit 74 to adjust the constants of the waveform control elements 70. In this case, a plurality of waveform control elements 70 having different constants are provided in the second RF filter 63.

The second RF filter 63 may be configured such that the impedance thereof is changeable. That is, the second RF filter 63 may have a variable impedance by configuring the non-waveform control element 71 of the second RF filter 63 as a variable element. The non-waveform control element 71 may be either a coil (inductor) or a capacitor (capacitor), for example. In addition, the non-waveform control element 70 is not limited to a coil and a capacitor and may be any variable impedance element (e.g., a diode or the like) having a constant variable by a voltage or current and capable of achieving the same function. The number and positions of non-waveform control elements 71 can also be appropriately designed by those skilled in the art. In addition, the element itself does not need to be variable, and the impedance may be varied, for example, by providing a plurality of elements with fixed impedance values and switching combinations of elements with fixed values using a switching circuit. The circuit configurations of the second RF filter 63 and the first RF filter 62 can be appropriately designed by those skilled in the art.

In addition, in the present embodiment, in the second RF filter 63, the waveform control element 70 is newly provided with respect to the configuration of the existing second RF filter 63. In this case, the degree of freedom in designing the waveform control element 70 is high. On the other hand, by changing the constant of the existing non-waveform control element 71 in the second RF filter 63, the non-waveform control element 71 may be caused to function as the waveform control element 70. In this case, the waveform control element 70 has a function other than the function of controlling the waveform of the DC voltage DC. For example, the waveform control element 70 has a function of attenuating RF power RF or a function of adjusting a tilt angle, which will be described later, by impedance control. Further, it is preferable to make each of these functions independent, and in such a case, it is necessary to perform design such as adjusting the circuit constant such that it is effective for waveform control but has no effect on impedance adjustment. A person skilled in the art can arbitrarily design the degree of influence on each of these functions and separation and independence of the functions. In such a case, the installation cost can be reduced since the waveform control element 70 is not newly installed.

Although the waveform control element 70 is provided inside the second RF filter 63 in the present embodiment, the waveform control element 70 may be provided inside the first RF filter 62. Alternatively, when a plurality of waveform control elements 70 are provided, the waveform control element 70 may be provided in each of the second RF filter 63 and the first RF filter 62.

As shown in FIG. 1, the plasma processing apparatus 1 further includes the pulse signal source 80. The pulse signal source 80 sends a pulse signal, that is, a signal for controlling pulse timing, to the first RF power supply 50, the second RF power supply 51, and the DC power supply 60 (pulse generator 65). The first RF power supply 50 and the second RF power supply 51 respectively supply RF power HF and RF power LF in the form of a pulse on the basis of the pulse signal. Moreover, the DC power supply 60 applies a DC voltage DC in the form of a pulse on the basis of the pulse signal. The pulse signal source 80 can control synchronization timing of the RF power HF, the RF power LF, and the DC voltage DC. In addition, this pulse signal source may be built in each of the first RF power supply 50, the second RF power supply 51, and the DC power supply 60.

The plasma processing apparatus 1 further includes a measuring device (not shown) for measuring a self-bias voltage of the edge ring 14 (or a self-bias voltage of the lower electrode 12 or the wafer W). The configuration of the measuring instrument can be appropriately designed by a person skilled in the art.

In the above plasma processing apparatus 1, a controller 100 is provided. The controller 100 is, for example, a computer including a CPU or a memory, and has a program storage (not shown). A program for controlling plasma processing in the plasma processing apparatus 1 is stored in the program storage. The program may be recorded on a computer-readable storage medium and installed in the controller 100 from the storage medium.

<Plasma Processing Method>

Next, plasma processing performed using the plasma processing apparatus 1 configured as described above will be described.

First, a wafer W is loaded into the chamber 10 and the wafer W is mounted on the electrostatic chuck 13. Thereafter, a DC voltage is applied to the first electrode 16a of the electrostatic chuck 13 such that the wafer W is electrostatically attracted to and held by the electrostatic chuck 13 by the Coulomb force. In addition, after the wafer W is loaded, the inside of the chamber 10 is decompressed to a desired degree of vacuum by the exhaust device 42.

Next, processing gases are supplied from the gas supply group 30 to the processing space S through the shower head 20. In addition, RF power HF for plasma generation is supplied to the lower electrode 12 by the first RF power supply 50 to excite the processing gases to generate plasma. At this time, the second RF power supply 51 may supply RF power LF for attraction of ions. Then, plasma processing is performed on the wafer W by the action of the generated plasma.

When plasma processing is finished, first, supply of the RF power HF from the first RF power supply 50 and supply of the processing gases by the gas supply group 30 are stopped. If the RF power LF is supplied during plasma processing, supply of the RF power LF is also stopped. Then, supply of a heat transfer gas to the back surface of the wafer W is stopped, and adsorption and holding of the wafer W by the electrostatic chuck 13 is stopped.

Thereafter, the wafer W is unloaded from the chamber 10, and a series of plasma processing for the wafer W is finished.

In addition, in plasma processing, there is a case in which plasma is generated using only the RF power LF from the second RF power supply 51 without using the RF power HF from the first RF power supply 50.

<Tilt Angle Control Method>

Next, a method of controlling a tilt angle in plasma processing described above will be described. The tilt angle is the inclination (angle) of a concave portion formed by plasma processing in the edge region of the wafer W with respect to the thickness direction of the wafer W. The tilt angle is an angle substantially that same as a gradient in an ion incident direction to the edge region of the wafer W with respect to the vertical direction. In the following description, the direction inside (center side) with respect to the thickness direction of the wafer W is referred to as an inner side, and the direction outside with respect to the thickness direction of the wafer W is referred to as an outer side.

Figure 4A:
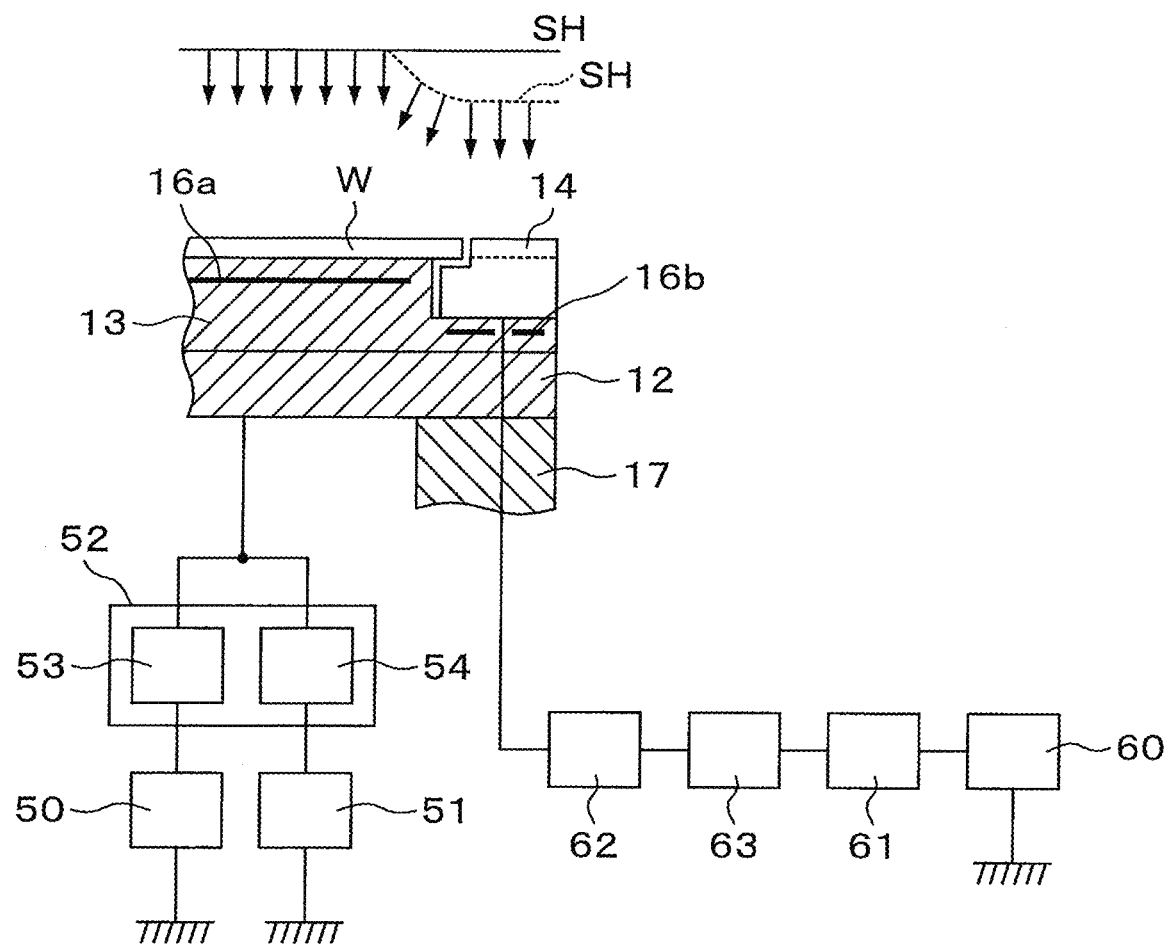
FIGS. 4A and 4B are explanatory diagrams showing a change in the shape of a sheath and occurrence of a gradient in an ion incident direction due to abrasion of an edge ring.
Figure 4B:
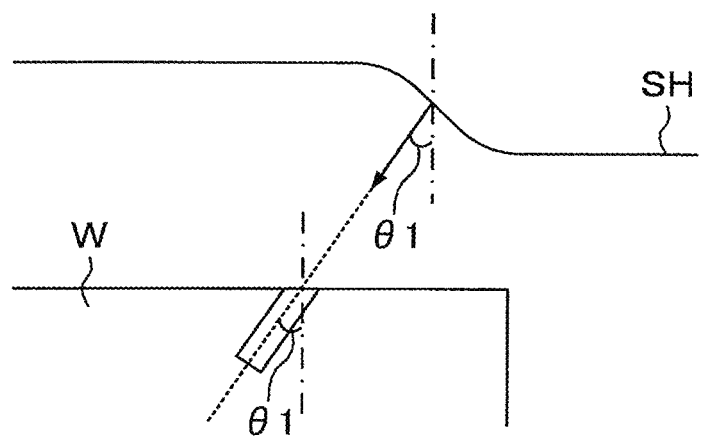

FIGS. 4A and 4B are explanatory diagrams showing change in the shape of the sheath and occurrence of a gradient in an ion incident direction due to abrasion of the edge ring. The edge ring 14 indicated by a solid line in FIG. 4A is in a state in which it has not been abraded. The edge ring 14 indicated by a dotted line is in a state in which it has been abraded and thus the thickness there of has decreased. The sheath SH indicated by the solid line in FIG. 4A has a shape when the edge ring 14 has not been abraded. The sheath SH indicated by the dotted line has a shape when the edge ring 14 has been abraded. In FIG. 4A, arrows indicate an ion incident direction when the edge ring 14 has been abraded.

As shown in FIG. 4A, in an example, the shape of the sheath SH is maintained flat above the wafer W and the edge ring 14 when the edge ring 14 has not been abraded. Accordingly, ions are incident in a direction substantially perpendicular to the front surface of the wafer W (vertical direction). Therefore, the tilt angle is 0 (zero) degrees.

On the other hand, when the edge ring 14 has been abraded and thus the thickness thereof has decreased, the thickness of the sheath SH decreases above the edge region of the wafer W and the edge ring 14 and the shape of the sheath SH changes to a downward convex shape. As a result, the ion incident direction to the edge region of the wafer W is inclined with respect to the vertical direction. In the following description, inclination of the concave portion formed by plasma processing toward the inner side by an angle $\theta 1$ when the ion incident direction is inclined inward by the angle $\theta 1$ with respect to the vertical direction, as shown in FIG. 4B, is called inner tilt. The cause of inner tilt is not limited to abrasion of the edge ring 14 described above. For example, when the voltage generated in the edge ring 14 is lower than the voltage in the wafer W, inner tilt occurs in the initial state. Moreover, inner tilt may be caused to occur intentionally in the initial state of the edge ring 14, and a tilt angle may be corrected by adjustment by the DC power supply 60 which will be described later, for example.

Figure 5A:
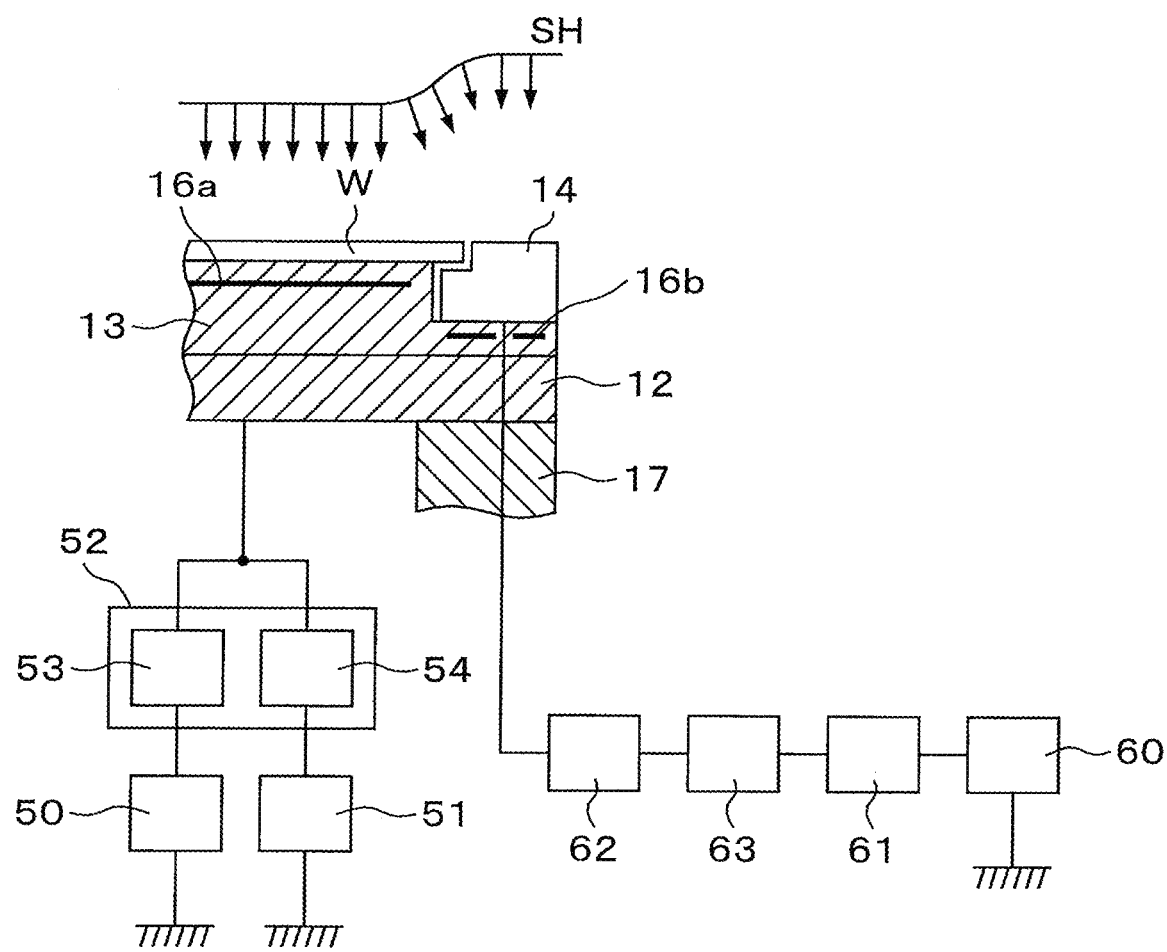
FIGS. 5A and 5B are explanatory diagrams showing a change in the shape of the sheath and occurrence of a gradient in the ion incident direction.
Figure 5B:
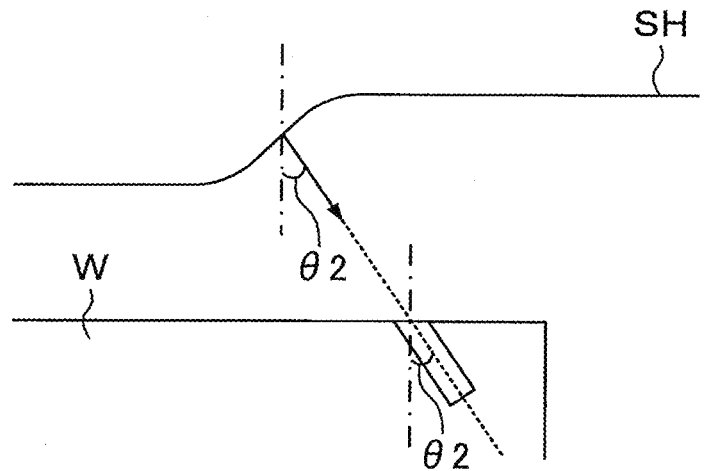

Further, as shown in FIGS. 5A and 5B, there may be a case in which the thickness of the sheath SH increases and the shape of the sheath SH changes to an upward convex shape above the edge region of the wafer W and the edge ring 14 with respect to the central region of the wafer W. For example, when the voltage generated in the edge ring 14 is high, the shape of the sheath SH may be an upward convex shape. In FIG. 5A, arrows indicate the ion incident direction. In the following description, inclination of the concave portion formed by plasma processing toward the outer side by an angle 82 when the ion incident direction is inclined outward by the angle 62 with respect to the vertical direction, as shown in FIG. 5B, is called outer tilt.

In the plasma processing apparatus 1 of the present embodiment, the tilt angle is controlled. Specifically, the tilt angle is controlled by adjusting the DC voltage DC from the DC power supply 60 and the impedance of the second RF filter 63 to control the ion incident angle. In this case, the waveform control element 70 for controlling the waveform of the DC voltage DC and the non-waveform control element 71 for varying the impedance are independent or have separate functions. The waveform control element 70 and the non-waveform control element 71 do not need to be different elements, but their functions need to be separated, and a circuit configuration for that purpose can be arbitrarily designed by a person skilled in the art.

[Adjustment of DC Voltage]

First, adjustment of the DC voltage DC from the DC power supply 60 will be described. In the DC power supply 60, the DC voltage DC applied to the edge ring 14 is set to a negative voltage having the sum of the absolute value of a self-bias voltage Vdc (hereinafter, referred to as "bias voltage Vdc" in some cases) and a set value $\Delta V$, that is, $-(|Vdc|+\Delta V)$, as the absolute value thereof. The bias voltage Vdc is the self-bias voltage of the wafer W, and is the self-bias voltage of the lower electrode 12 when one or both of the RF powers RF are supplied and the DC voltage DC from the DC power supply 60 is not applied to the lower electrode 12. The set value $\Delta V$ is provided by the controller 100.

The controller 100 specifies the set value $\Delta V$ from an abrasion amount of the edge ring 14 estimated from the abrasion amount of the edge ring 14 (the amount of reduction from the initial value of the thickness of the edge ring 14) and processing conditions of plasma processing (for example, processing time) using a predetermined function or table. That is, the controller 100 determines the set value αy inputting the abrasion amount of the edge ring 14 and the bias voltage into the function or referring to the table using the abrasion amount of the edge ring 14 and the bias voltage.

In determination of the set value $\Delta V$, the controller 100 may use a difference between the initial thickness of the edge ring 14 and the thickness of the edge ring 14 actually measured, for example, using a measuring device such as a laser measuring device or a camera, as the abrasion amount of the edge ring 14. Further, the abrasion amount of the edge ring 14 may be estimated from a change in the mass of the edge ring 14 measured by a measuring device, such as a mass meter, for example. Alternatively, the controller 100 may estimate the abrasion amount of the edge ring 14 from a specific parameter using another predetermined function or table to determine the set value $\Delta V$. This specific parameter may be any of the bias voltage Vdc, a peak value Vpp of the RF power HF or the RF power LF, a load impedance, electrical characteristics of the edge ring 14 or the periphery of the edge ring 14, and the like. The electrical characteristics of the edge ring 14 or the periphery of the edge ring 14 include voltages and current values at arbitrary locations around the edge ring 14 or the periphery of the edge ring 14, resistance values including the edge ring 14, and the like. The other function or table is predetermined to establish a relationship between the specific parameter and the abrasion amount of the edge ring 14. In order to estimate the abrasion amount of the edge ring 14, the plasma processing apparatus 1 operates under measurement conditions for estimating the abrasion, that is, setting of the RF power HF, the RF power LF, the pressure in the processing space S, and flow rates of processing gases supplied to the processing space S before actual execution of plasma processing or during maintenance of the plasma processing apparatus 1. Then, the specific parameter is acquired, and the abrasion amount of the edge ring 14 is identified by inputting the specific parameter into the other function or by referring to the table using the specific parameter.

In the plasma processing apparatus 1, the DC voltage DC is applied from the DC power supply 60 to the edge ring 14 during plasma processing, that is, during a period in which one or both of the RF power HF and the RF power LF are supplied. Accordingly, the shape of the sheath above the edge ring 14 and the edge region of the wafer W is controlled, and thus the gradient in the ion incident direction to the edge region of the wafer W is reduced and the tilt angle is controlled. As a result, a concave portion substantially parallel to the thickness direction of the wafer W is formed over the entire region of the wafer W.

More specifically, the bias voltage Vdc is measured by a measuring device (not shown) during plasma processing. In addition, the DC voltage DC is applied from the DC power supply 60 to the edge ring 14. The value of the DC voltage DC applied to the edge ring 14 is −(|Vdc|+ΔV) as described above. |Vdc| is the absolute value of the measured value of the bias voltage Vdc acquired by the measuring device immediately before application of the DC voltage, and ΔV is a set value determined by the controller 100. In this way, the DC voltage DC applied to the edge ring 14 is determined from the bias voltage Vdc measured during plasma processing. Then, even if a change occurs in the bias voltage Vdc, the DC voltage DC generated by the DC power supply 60 is corrected, and thus the tilt angle is appropriately corrected.

[Adjustment of Impedance]

Next, adjustment of the impedance of the 2nd RF filter 63 will be described.

Figure 6:
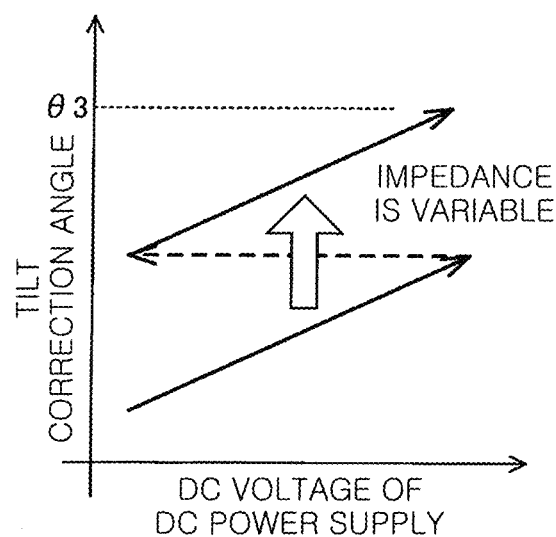
FIG. 6 is an explanatory diagram showing a relationship between a DC voltage from a DC power supply, the impedance of the second RF filter, and a tilt correction angle.

FIG. 6 is an explanatory diagram showing a relationship among the DC voltage DC from the DC power supply 60, the impedance of the second RF filter 63, and a corrected angle of the tilt angle (hereinafter referred to as "tilt correction angle"). The vertical axis of FIG. 6 represents the tilt correction angle and the horizontal axis represents the DC voltage DC from the DC power supply 60. As shown in FIG. 6, when the absolute value of the DC voltage DC from the DC power supply 60 is increased, the tilt correction angle increases. Further, the tilt correction angle increases when the impedance of the second RF filter 63 is adjusted. That is, by adjusting the impedance in this way, the correlation between the DC voltage DC and the tilt correction angle can be offset such that the tilt correction angle increases.

For example, when the edge ring 14 has been abraded, as shown in FIGS. 4A and 4B, the ion incident angle is inclined inward with respect to the vertical direction, resulting in inner tilt. Therefore, when the absolute value of the DC voltage DC from the DC power supply 60 is increased as shown in FIG. 6, the tilt correction angle increases to cause the tilt angle inclined toward the inner side to change to the outer side, and thus the tilt angle can be corrected to 0 (zero). However, if the absolute value of the DC voltage DC is increased to an excessively high level, discharge occurs between the wafer W and the edge ring 14. Therefore, the DC voltage DC applicable to the edge ring 14 is limited, and even if the tilt angle is controlled only by adjusting the DC voltage DC, the control range is limited.

Therefore, by adjusting the impedance of the second RF filter 63, the correlation between the DC voltage DC and the tilt correction angle is offset such that the tilt correction angle increases, as shown in FIG. 6. In this case, the tilt angle can be corrected (returned to 0) by increasing the absolute value of the DC voltage DC from the DC power supply 60 again to adjust the tilt correction angle to a target angle θ3. Therefore, according to the present embodiment, the control range of the tilt angle can be extended without changing the adjustment range of the DC voltage DC by adjusting the impedance.

Although the tilt angle is controlled by adjusting the DC voltage DC from the DC power supply 60 and the impedance of the second RF filter 63 in the present embodiment, the tilt angle may be controlled only by the DC voltage DC.

<Method of Controlling Waveform of DC Voltage>

In order to control the tilt angle as described above, the DC voltage DC applied from the DC power supply 60 to the edge ring 14 is adjusted to set the set value ΔV that is the potential difference between the wafer W and the edge ring 14. At this time, when the timing of applying the DC voltage DC is shifted and thus an unintended potential difference occurs, for example, discharge may occur between the wafer W and the edge ring 14. As a result, the wafer W may be damaged.

Therefore, in the present embodiment, the waveform of the DC voltage DC is controlled by adjusting the constant of the waveform control element 70 to control a time required for the DC voltage DC to reach a desired value, that is, the negative voltage (=−(|Vdc|+ΔV)) having the sum of the absolute value of the bias voltage Vdc and the set value ΔV as the absolute value thereof, such that the edge ring 14 has followability to potential change in the wafer W.

Figure 7:
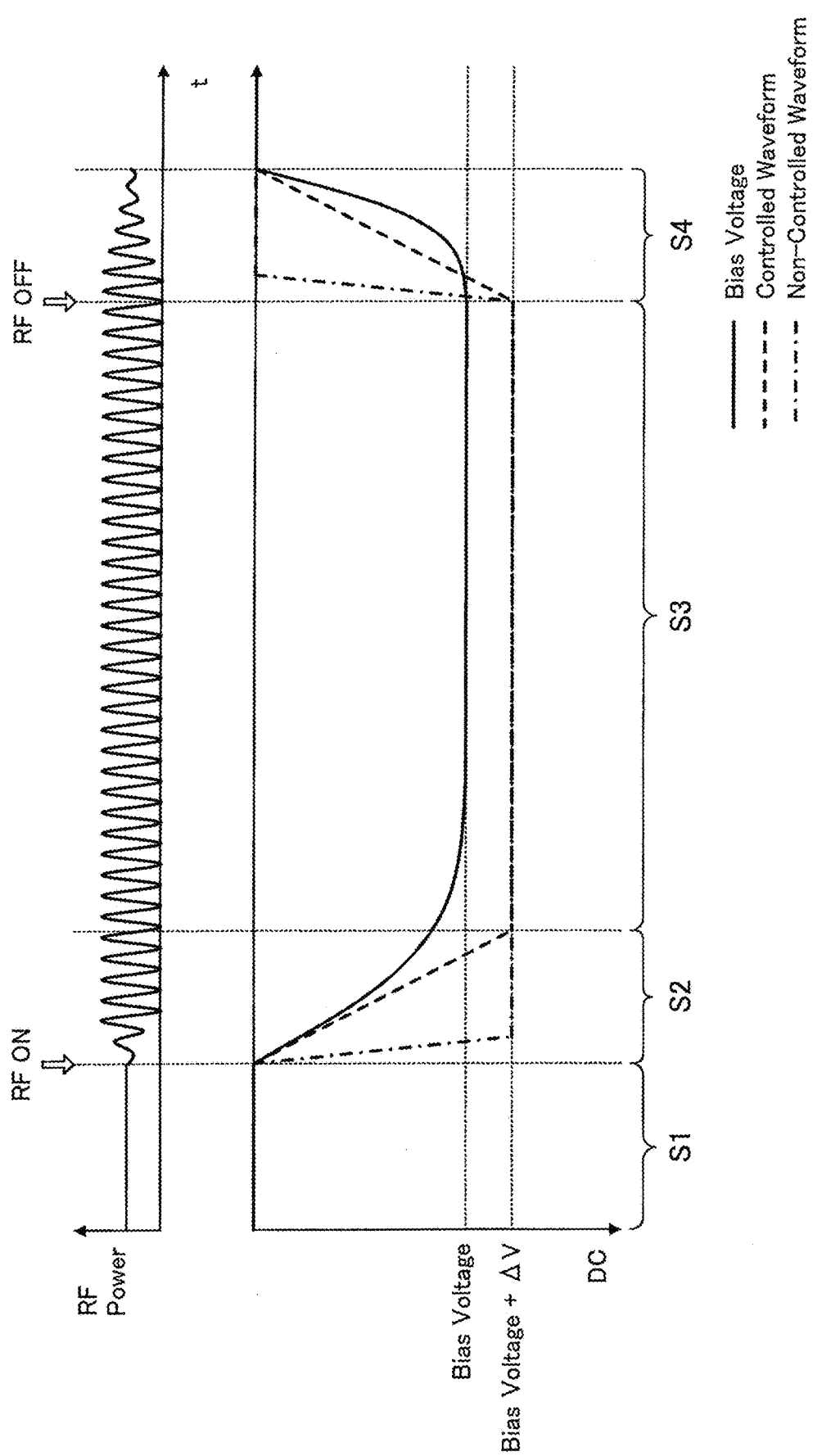
FIG. 7 is an explanatory drawing showing change over time in RF power and a DC voltage in the present embodiment.

FIG. 7 is an explanatory diagram showing changes over time in the RF power RF and the DC voltage DC. The vertical axis represents the RF power RF and the horizontal axis represents time t in the upper graph of FIG. 7. The vertical axis represents the DC voltage DC and the horizontal axis represents time t in the lower graph of FIG. 7. In the lower graph of FIG. 7, "Bias Voltage" indicated by a solid line represents a bias voltage generated by the RF power RF. "Controlled Waveform" indicated by a dotted line represents a DC voltage DC on which waveform control has been performed by adjusting the constant of the waveform control element 70 in the present embodiment. "Non-Controlled Waveform" indicated by a dashed-dotted line represents a comparative example of the present embodiment and shows a DC voltage DC on which waveform control is not performed.

(Step S1)

Step S1 is a step of performing static elimination of the edge ring 14. In step S1, the switching element 66a of the DC power supply circuit 66 is opened (DC OFF), and the switching element 67a of the static elimination circuit 67 is closed (static elimination ON). Then, the edge ring 14 and the static elimination circuit 67 are connected and the electric charge of the edge ring 14 is removed through the charge elimination circuit 67. In this step S1, supply of the RF power RF to the lower electrode 12 is stopped (RF OFF). In addition, static elimination processing for the edge ring 14 in step S1 may be omitted.

(Step S2)

In step S2, the RF power RF is supplied to the lower electrode 12 (RF ON) and the DC voltage DC is applied to the edge ring 14 (DC ON) to increase the DC voltage DC to a desired value, that is, $-(|Vdc|+\Delta V)$. In step S2, the switching element 66a of the DC power supply circuit 66 is closed (DC ON) and the switching element 67a of the static elimination circuit 67 is opened (static elimination OFF).

In step S2, at the time of RF ON, reflection of the RF power RF occurs and thus the RF power RF supplied to the lower electrode 12 gradually rises. For this reason, the bias voltage caused by the RF power RF, that is, the potential generated in the wafer W, also gradually and slowly rises with respect to the RF ON timing, as represented by "Bias Voltage" indicated by the solid line. On the other hand, as represented by "Non-Controlled Waveform" indicated by the dashed-dotted line, the DC power supply 60 starts normally quickly, and the DC voltage DC rapidly rises. Then, the potential of the edge ring 14 follows the potential of the DC power supply 60 and becomes identical thereto and thus rapidly rises. For this reason, a potential difference greater than intended occurs between the wafer W and the edge ring 14, and thus discharge may occur between the wafer W and the edge ring 14.

Therefore, in the present embodiment, the waveform of the DC voltage DC is controlled by adjusting the constant of the waveform control element 70. Specifically, when application of the DC voltage DC is started (DC ON), the constant of the waveform control element 70 is adjusted such that the rising rate of the DC voltage DC becomes the same as the rising rate of "Bias Voltage" indicated by the solid line, as represented by "Controlled Waveform" indicated by the dotted line. The rising rate is the inclination of the graph in FIG. 7. In this case, the potential difference between the bias voltage (the potential of the wafer W) and the DC voltage DC (the potential of the edge ring 14) is curbed. By setting this potential difference within a predetermined threshold value, discharge between the wafer W and the edge ring 14 can be curbed.

Further, in the present embodiment, the constant of the waveform control element 70 is adjusted such that an application time for which the DC voltage DC becomes a steady state of $-(|Vdc|+\Delta V)$ and is applied to the edge ring 14 is maximized. The maximum value of the application time is equal to the time for which the RF power RF is supplied (RF ON). In this case, the time for performing plasma processing in step S3 which will be described later can be maximized, and thus plasma processing can be performed efficiently.

(Step S3)

Step S3 is a step of performing plasma processing on the wafer W by applying the DC voltage DC to the edge ring 14 (DC ON, static elimination OFF) while supplying the RF power RF to the lower electrode 12 (RF ON). At this time, the DC voltage DC is maintained in a steady state of $-(|Vdc|+\Delta V)$.

(Step S4)

Step S4 is a step of stopping supply of the RF power RF to the lower electrode 12 (RF OFF) and stopping application of the DC voltage DC to the edge ring 14 (DC OFF) to decrease the DC voltage DC to a desired value. At this time, static elimination occurs in the edge ring 14 (static elimination ON). In step S4, the switching element 66a of the DC power supply circuit 66 is opened, and the switching element 67a of the static elimination circuit 67 is closed (static elimination ON).

In step S4, at the time of RF OFF, static elimination is gently performed by hardware (device) or plasma time constant, and thus the bias voltage, that is, the potential of the wafer W, falls gently and slowly as represented by "Bias Voltage" indicated by the solid line. On the other hand, the DC voltage DC rapidly falls and thus the potential of the edge ring 14 also rapidly falls, as represented by "Non-Controlled Waveform" indicated by the dashed-dotted line. For this reason, a potential difference greater than intended occurs between the wafer W and the edge ring 14 and thus discharge may occur between the wafer W and the edge ring 14.

Therefore, in the present embodiment, the waveform of the DC voltage DC is controlled by adjusting the constant of the waveform control element 70. Specifically, when the switching element 67a of the static elimination circuit 67 is closed (static elimination ON), the constant of the waveform control element 70 is adjusted such that the potential difference between the bias voltage and the DC voltage DC is reduced. At this time, the bias voltage may be measured in advance or may be determined from a calculated time constant or the like. In this case, the potential difference between the bias voltage (the potential of the wafer W) and the DC voltage DC (the potential of the edge ring 14) can be curbed. Then, by setting this potential difference within a predetermined threshold value, discharge between the wafer W and the edge ring 14 can be curbed.

In addition, when the switching unit 61 does not include the static elimination circuit 67, if the switching unit 61 is opened or application of the DC voltage DC is stopped (DC OFF), the potential difference between the bias voltage (the potential of the wafer W) and the DC voltage DC (the potential of the edge ring 14) can be curbed following the plasma potential. As another example, when the DC power supply 60 is a power supply having two or more DC voltage outputs, if switching to a second DC voltage DC different from the first DC voltage DC applied at the time of DC ON is performed, a rate of switching to the second DC voltage DC is controlled.

According to the present embodiment, the potential difference between the wafer W and the edge ring 14 can be curbed by adjusting the constant of the waveform control element 70 to control the waveform of the DC voltage DC in both cases of RF ON and RF OFF.

Here, conditions for optimizing the waveform control element 70 will be described. The constant of the waveform control element 70 may be changed in advance before processing to determine an optimal constant.

Specifically, the waveform control element 70 may be optimized to satisfy all of the following five conditions, or the waveform control element 70 may be optimized to satisfy any one or a plurality of the five conditions according to specifications.

(1) The first condition is to maximize the application time of the DC voltage DC while making the rising rate of the DC voltage DC the same as the rising rate of the bias voltage as described above. To achieve this condition, the constant of the waveform control element 70, the configuration of the waveform control element 70 to be used, and the like are optimized.

(2) The second condition is that, when the waveform control element 70 is newly added and thus discharge (arcing) occurs due to the potential difference between the wafer W and the edge ring 14, the arcing scale does not increase. In order to achieve this condition, optimization of the constant of the waveform control element 70, employment of a specific waveform control element 70, employment of a combination of specific waveform control elements 70, or the like is performed.

(3) The third condition is that power consumption of the DC power supply 60 does not increase. In order to achieve this condition, optimization of the constant of the waveform control element 70, configuration of only a specific waveform control element 70, or the like is performed.

(4) The fourth condition is a balance with an existing element. For example, in the case where there is an existing non-waveform control element 71 inside the second RF filter 63 in the present embodiment, the constant of the waveform control element 70 is optimized after taking the constant of the non-waveform control element 71 into account.

(5) The fifth condition is to curb the influence of RF power RF. For example, when the waveform control element 70 is provided in the second RF filter 63 as in the present embodiment, the constant of the waveform control element 70, the configuration of the waveform control element 70 to be used, and the like are optimized without damaging the function of attenuating the RF power RF by the second RF filter 63.

In addition, when the constant of the waveform control element 70 is made variable as in the present embodiment, the constant of the waveform control element 70 can be optimized for each pulse frequency of the RF power RF or the DC voltage DC. In this case, the constant of the waveform control element 70 may be changed at any timing.

Further, the constant of the waveform control element 70 may be feedback-controlled. For example, when the constant of the waveform control element 70 is changed for each pulse frequency of the RF power RF or the DC voltage DC, the pulse frequency of the RF power RF or the DC voltage DC may be measured and the constant of the waveform control element 70 may be adjusted based on the measurement result. Further, for example, a measuring device (not shown) for monitoring the voltage and current with respect to the waveform of the DC voltage DC may be provided along with the waveform control element 70 and the constant of the waveform control element 70 may be adjusted such that the DC voltage DC has an arbitrary waveform shape and value. Further, for example, the waveform of the DC voltage DC may be measured using the monitoring function of the DC power supply 60, and the constant of the waveform control element 70 may be adjusted based on the result. For example, a sensor for measuring the waveform shape may be provided in the second RF filter 63 and the constant of the waveform control element 70 may be adjusted based on the measurement result (waveform shape) of the sensor.

<Another Embodiment of Waveform Control Element>

Although the waveform control element 70 is provided in the second RF filter 63 in the above embodiment, the installation position of the waveform control element 70 is not limited thereto and may be appropriately designed by those skilled in the art such that the waveform control element 70 is positioned between the DC power supply 60 and the edge ring 14. Hereinafter, another embodiment of the waveform control element 70 will be described.

Figure 8:
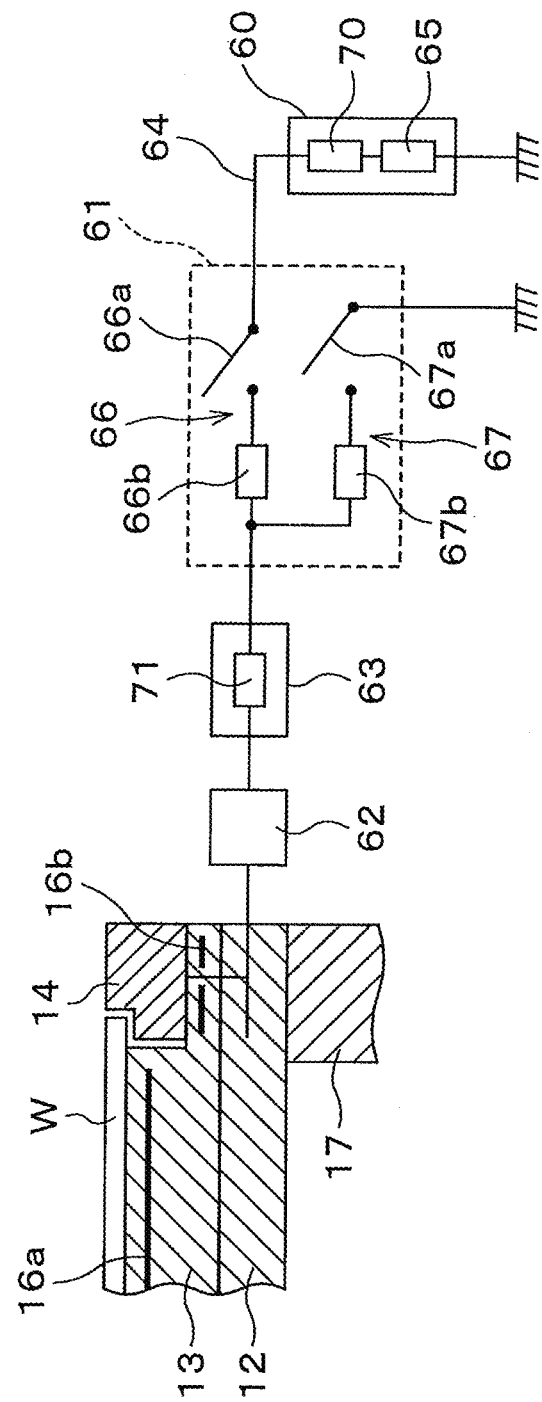
FIG. 8 is an explanatory diagram of a power supply system of a plasma processing apparatus according to another embodiment.

As shown in FIG. 8, the waveform control element 70 may be provided inside the DC power supply 60. The waveform control element 70 is provided on the side of the edge ring 14 rather than the pulse generator 65. For example, when the switching unit 61 is omitted and a switching circuit (not shown) corresponding to the switching unit 61 is provided inside the DC power supply 60, the waveform control element 70 is provided on the side of the edge ring 14 rather than the switching circuit. In this case, as shown in FIGS. 3A to 3D, the number and arrangement of waveform control elements 70 can be appropriately designed by those skilled in the art. The waveform control element 70 may be newly provided for an existing element inside the DC power supply 60 or an existing element may be caused to function as the waveform control element 70 by changing the constant thereof.

Figure 9:
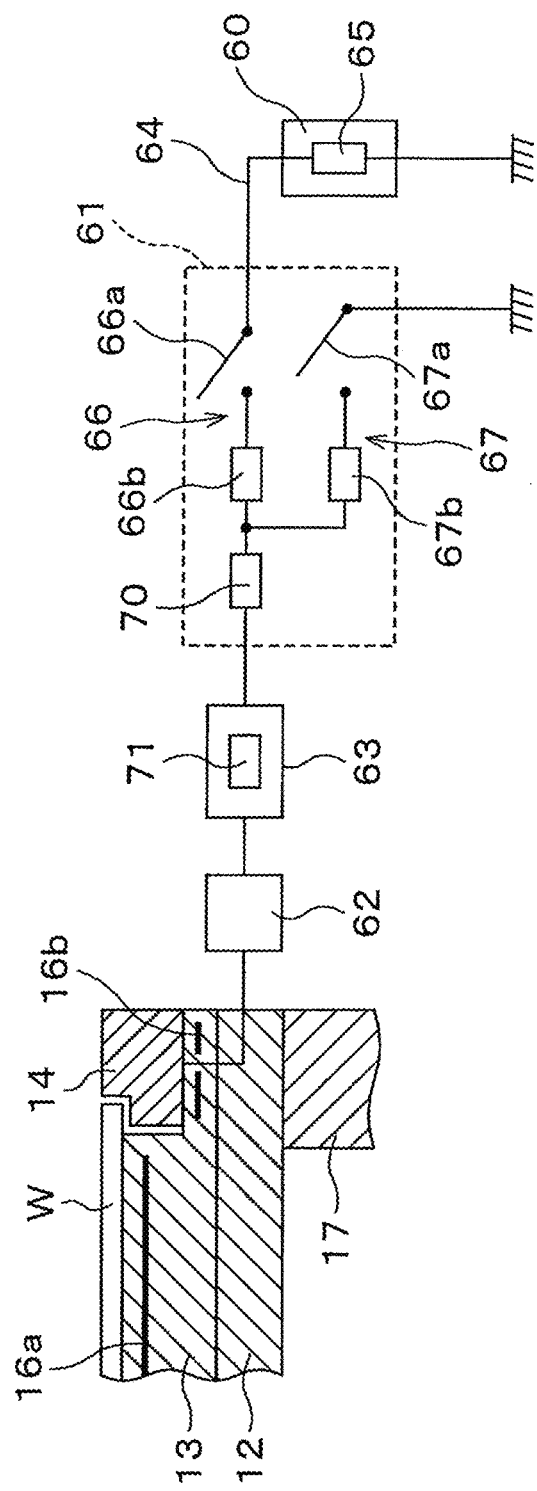
FIG. 9 is an explanatory diagram of a power supply system of a plasma processing apparatus according to another embodiment.

As shown in FIG. 9, the waveform control element 70 may be provided inside the switching unit 61. In this case, as shown in FIGS. 3A to 3D, the number and arrangement of waveform control elements 70 can be appropriately designed by those skilled in the art. In addition, the waveform control element 70 may be newly provided for an existing element of the switching unit 61, that is, the dumping elements 66b and 67b. Alternatively, the existing dumping elements 66b and 67b may be caused to function as the waveform control element 70 by changing the constants thereof. Moreover, a dumping element may be newly added to the switching unit 61 and caused to function as the waveform control element 70 by changing the constant thereof.

Figure 10:
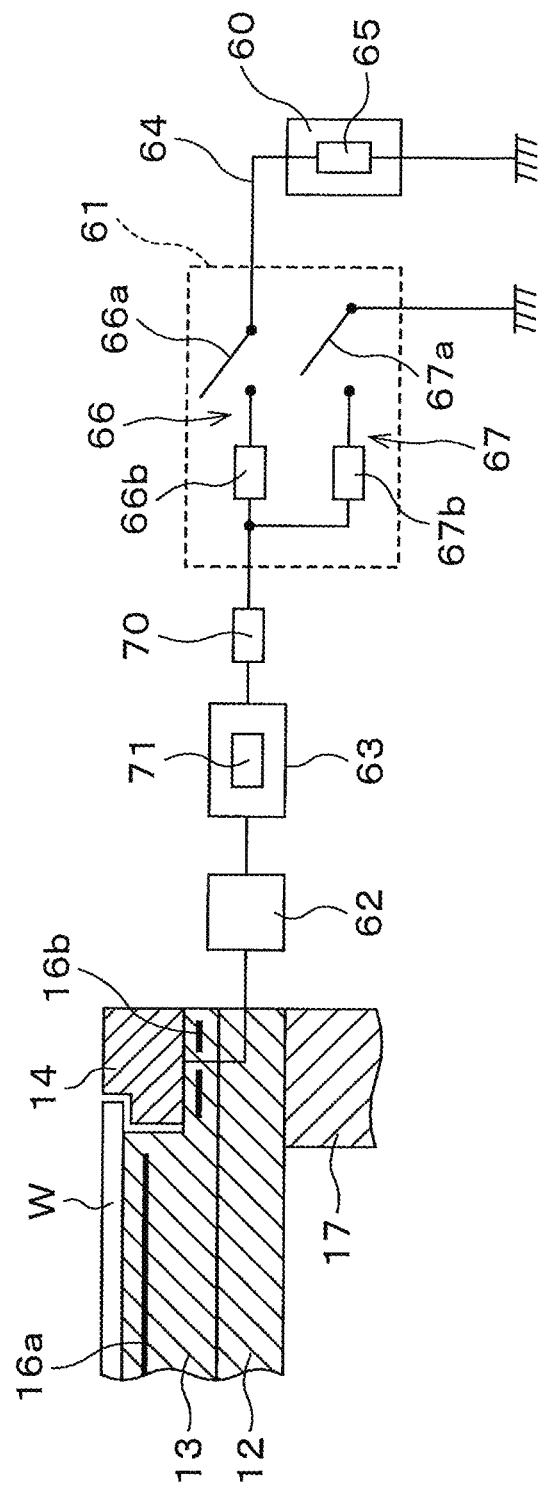
FIG. 10 is an explanatory diagram of a power supply system of a plasma processing apparatus according to another embodiment.

As shown in FIG. 10, the waveform control element 70 may be provided in the path 64 electrically connecting the DC power supply 60 and the edge ring 14. However, considering the influence of RF power RF, it is desirable that the waveform control element 70 be provided in the path 64 connecting the DC power supply 60 and the second RF filter 63 or the path 84 connecting the second RF filter 63 and the first RF filter 62.

<Another Embodiment of Method of Controlling Waveform of DC Voltage>

Although the waveform of the DC voltage DC is controlled by adjusting the constant of the waveform control element 70 at the time of RF ON and at the time of RF OFF in the above embodiment, a dead time function for pulse timing on the side of the DC power supply 60 may be used in addition to waveform control. In such a case, by providing the dead time, a floating potential state is formed at the output terminal of the DC power supply 60 such that the edge ring 14 has followability to a potential change in the wafer W.

In addition, the dead time function normally provided in the switching unit 61 is a function of, when the DC power supply circuit 66 and the static elimination circuit 67 are switched, delaying switching to one circuit such that these two circuits are not turned on at the same time. Since a short-circuit occurs when the two circuits are turned on at the same time, such a dead time function is provided. When the RF power RF is supplied in a pulse shape, the pulse signal is transmitted from the pulse signal source 80 and is used as a synchronization signal in the first RF power supply 50, the second RF power supply 51, and the DC power supply 60. The dead time function provides a dead time for this pulse signal. During this dead time, the DC power supply 60 is neither ON nor OFF, and in an indefinite state. In the following description, a normal dead time may be called "dead time Do" and the dead time in the present embodiment may be called "dead time Dt."

Figure 11:
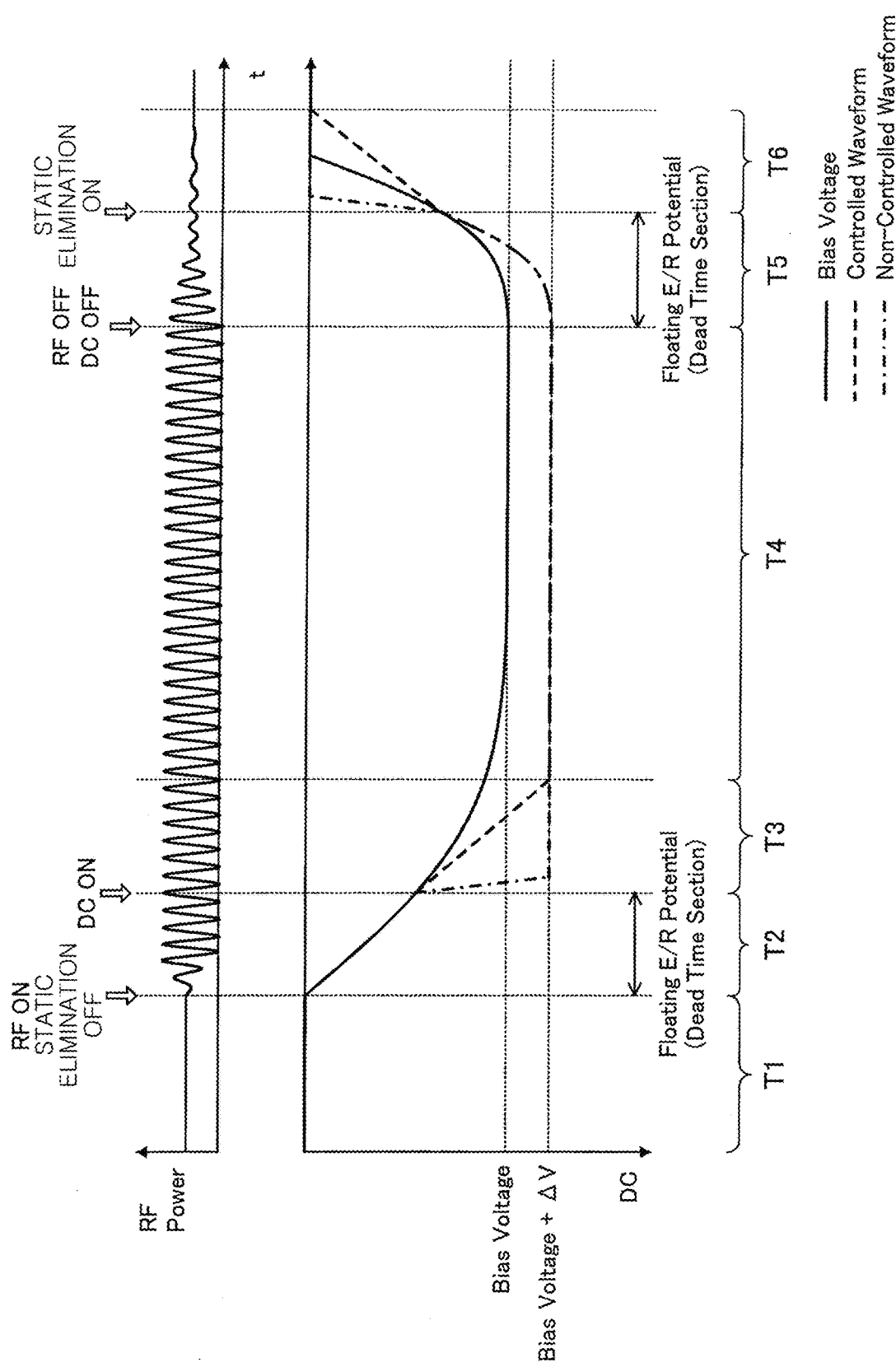
FIG. 11 is an explanatory diagram showing change over time in RF power and a DC voltage in another embodiment.

FIG. 11 is an explanatory diagram showing changes over time in the RF power RF and the DC voltage DC. FIG. 11 is the same graph as FIG. 7. In the lower graph of FIG. 11, "Bias Voltage" indicated by a solid line represents a bias voltage generated by RF power RF. "Controlled Waveform" indicated by a dotted line represents a DC voltage DC on which waveform control has been performed by adjusting the constant of the waveform control element 70 in the present embodiment. "Non-Controlled Waveform" indicated by the dashed-dotted line represents a case in which a DC voltage DC on which waveform control is not performed as a comparative example of the present embodiment.

(Step T1)

Step T1 is a step of performing static elimination of the edge ring 14. The static elimination processing of step T1 is the same as that of the aforementioned step S1. In addition, static elimination processing performed on the edge ring 14 of step T1 may be omitted.

(Step T2)

Step T2 corresponds to a section from when the RF power RF is supplied to the lower electrode 12 (RF ON) until when the DC voltage DC is applied to the edge ring 14 (DC ON), that is, a first dead time Dt1. In step T2, the switching element 67a of the static elimination circuit 67 is opened (static elimination OFF) while the switching element 66a of the DC power supply circuit 66 is kept open (DC OFF). That is, the edge ring 14 is not connected to any of the DC power supply circuit 66 and the static elimination circuit 67.

Here, in the case of the dead time Do of the normal switching unit 61, the DC power supply 60 is in an indefinite state which is neither on nor off, and thus it is desirable that the dead time Do be as short as possible. On the other hand, in the first dead time Dt1 of step T2, the switching element 66a of the DC power supply circuit 66 is opened while the switching element 67a of the static elimination circuit 67 is kept in an open state, and the output terminal of the DC power supply 60 is set to a floating potential in an indefinite state. That is, by setting an idle state in which both the DC power supply circuit 66 and the static elimination circuit 67 are not used, the output terminal of the DC power supply 60 becomes a floating potential during the first dead time Dt1. In this floating potential state, the potential of the edge ring 14 gradually rises following the potential of the wafer W. Therefore, when the first dead time Dt1 has elapsed, the potential difference between the wafer W and the edge ring 14 decreases.

(Step T3)

Step T3 is a step of applying the DC voltage DC to the edge ring 14 (DC ON) while the RF power RF is supplied to the lower electrode 12 (RF ON) to increase the DC voltage DC to a desired value, that is, $-(|Vdc|+\Delta V)$. In step T3, the switching element 66a of the DC power supply circuit 66 is closed (DC ON), and the switching element 67a of the static elimination circuit 67 is opened (static elimination OFF).

In step T3, the potential of the edge ring 14 becomes equal to the potential of the wafer W (potential of the plasma and the sheath) to reach the bias voltage Vdc based on the RF power RF (excluding reflection that has occurred).

In addition, at the time of DC ON in step T3, the waveform of the DC voltage DC is controlled by adjusting the constant of the waveform control element 70 as in the above-described embodiment. Specifically, when application of the DC voltage DC is started (DC ON), the constant of the waveform control element 70 is adjusted such that the rising rate of the DC voltage DC becomes the same as the rising rate of "Bias Voltage" indicated by the solid line, as represented by "Controlled Waveform" indicated by the dotted line. In this case, the potential difference between the bias voltage (the potential of the wafer W) and the DC voltage DC (the potential of the edge ring 14) can be curbed. Then, by setting this potential difference within a predetermined threshold value, discharge between the wafer W and the edge ring 14 can be curbed.

(Step T4)

Step T4 is a step of performing plasma processing on the wafer W by applying the DC voltage DC to the edge ring 14 (DC ON, electric elimination OFF) while supplying the RF power RF to the lower electrode 12 (RF ON). At this time, the DC voltage DC is maintained in a steady state of $-(|Vdc|+\Delta V)$.

(Step T5)

Step T5 corresponds to a section from when supply of the RF power RF to the lower electrode 12 is stopped (RF OFF) until when application of the DC voltage DC to the edge ring 14 is stopped (DC ON), that is, a second dead time Dt2. In step T5, the switching element 67a of the static elimination circuit 67 is opened (static elimination OFF) and the switching element 66a of the DC power supply circuit 66 is opened (DC OFF). That is, the edge ring 14 is not connected to any of the DC power supply circuit 66 and the static elimination circuit 67.

In the second dead time Dt2 of step T5, the switching element 66a of the DC power supply circuit 66 is opened while the switching element 67a of the static electricity elimination circuit 67 is kept in an open state, and the output terminal of the DC power supply 60 is set to a floating potential. That is, by setting an idle state in which both the DC power supply circuit 66 and the static elimination circuit 67 are not used, the output terminal of the DC power supply 60 becomes a floating potential during the second dead time Dt2. When the DC power supply 60 is in a floating potential state, the potential of the edge ring 14 gradually falls following the potential of the wafer W. Therefore, when the second dead time Dt2 has elapsed, the potential difference between the wafer W and the edge ring 14 decreases.

(Step T6)

In step T6, application of the DC voltage DC to the edge ring 14 is stopped (DC OFF) in while supply of the RF power RF to the lower electrode 12 is stopped (RF OFF) to decrease the DC voltage DC to a desired value. In step T6, the switching element 66a of the DC power supply circuit 66 is opened, and the switching element 67a of the static elimination circuit 67 is opened (static elimination OFF).

At the time of DC OFF in step T6, the waveform of the DC voltage DC is controlled by adjusting the constant of the waveform control element 70 as in the above-described embodiment. Specifically, when the switching element 67a of the static elimination circuit 67 is closed (static elimination ON), the constant of the waveform control element 70 is adjusted such that the potential difference between the bias voltage and the DC voltage DC is reduced. In this case, the potential difference between the bias voltage (the potential of the wafer W) and the DC voltage DC (the potential of the edge ring 14) can be curbed. Then, by setting this potential difference within a predetermined threshold value, discharge between the wafer W and the edge ring 14 can be curbed.

In addition, in the present embodiment, the constraint common to the dead time Dt1 and the dead time Dt2 is the ratios of the dead times Dt1 and Dt2 to the time (DC ON time) for which the DC voltage DC is applied to the edge ring 14. Since the DC voltage DC is not applied for the dead times Dt1 and Dt2, if the dead times Dt1 and Dt2 increase, separation from the application state of the DC voltage DC synchronized with the RF power RF occurs. Therefore, the dead times Dt1 and Dt2 are determined based on the DC ON time. In addition, the necessary minimum ratios of the dead times Dt1 and Dt2 are determined from process evaluation results of plasma processing.

A specific method of determining the first dead time Dt1 at the time of RF ON is as follows. That is, a reflection time after supplying the RF power RF is measured in advance, and a time equal to or longer than the reflection time is determined as the first dead time Dt1. Alternatively, the potential of the edge ring 14 may be measured and the first dead time Dt1 may be determined based on the RF power RF and the potential of the edge ring 14.

A detailed method of determining the second dead time Dt2 at the time of RF OFF is as follows. That is, the potential of the edge ring 14 is measured, and the second dead time Dt2 is determined such that static elimination occurs in the edge ring 14 after the potential of the edge ring 14 is sufficiently lowered. Alternatively, the RF power RF may be measured and the second dead time Dt2 may be determined based only on the RF power RF.

According to the present embodiment, at the time of RF ON, the first dead time Dt1 is provided between RF ON and DC ON in addition to control of the waveform of the DC voltage DC by the waveform control element 70, and thus the potential difference between the wafer W and the edge ring 14 can be further curbed. In addition, at the time of RF OFF, similarly, the second dead time Dt2 is provided between RF OFF and DC OFF in addition to control of the waveform of the DC voltage DC by the waveform control element 70, and thus the potential difference between (14) can be further curbed.

Here, when conventional functions are provided as the functions of steps T2 and T5 of the present embodiment, timing signals capable of determining three states including a DC ON state, a DC OFF state, and a floating potential, including two pulse timing signals usually used, are required. Therefore, the device configuration becomes very complicated.

In this respect, by using the dead times Dt1 and Dt2 in the present invention, it is possible to determine a timing at which the potential of the edge ring 14 follows the potential of the wafer W can be determined in any DC power supply. In addition, since the timing of the floating potential is formed on the side of the DC power supply 60, the same pulse timing signal as that of the RF power RF can be used. In other words, the existing pulse signal source 80 can be used, and thus there is no need to re-create the pulse signal source 80.

The methods of controlling the DC voltage DC at the time of RF ON and RF OFF are not limited to the above-described embodiment. For example, step T2 may be omitted and only control of the waveform of DC voltage DC in step T3 may be performed at the time of RF ON, and control of the DC voltage DC according to the second dead time Dt2 in step T5 and control of the waveform of the DC voltage DC in step T6 may be performed at the time of RF OFF. Further, for example, control of the DC voltage DC according to the first dead time Dt1 in step T2 and control of the waveform the DC voltage DC in step T3 may be performed at the time of RF ON, and step T5 may be omitted and only control of the waveform of the DC in step T6 may be performed at the time of RF OFF.

Other Embodiments

Figure 12:
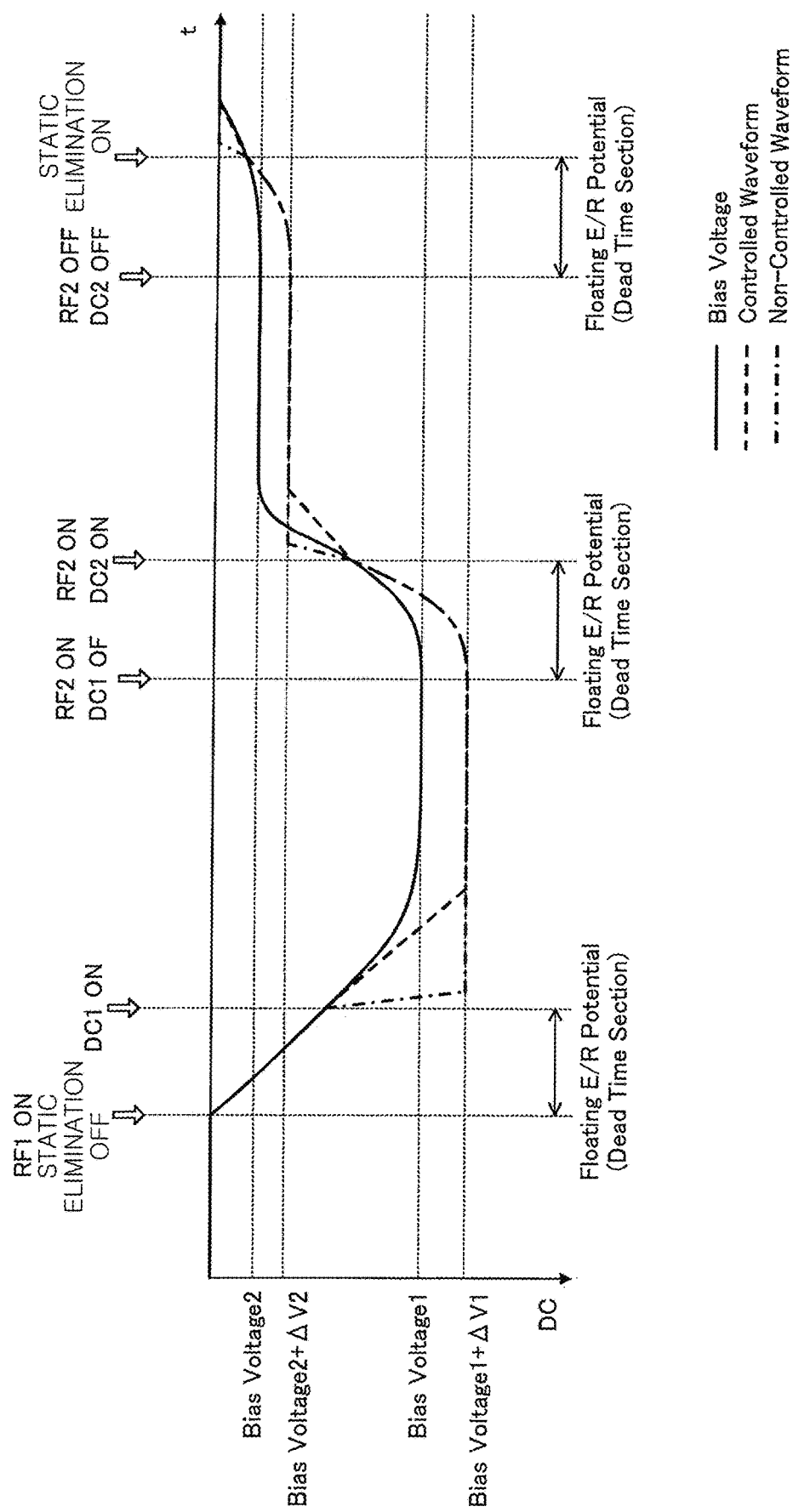
FIG. 12 is an explanatory diagram showing change over time in RF power and a DC voltage in another embodiment.

The above embodiment is applicable even when the DC power supply 60 is a power supply having two or more DC voltage outputs. FIG. 12 is an explanatory diagram showing change over time in RF power and a DC voltage DC in another embodiment. FIG. 12 is the same graph as FIGS. 7 and 11, and thus detailed description thereof is omitted. In addition, in FIG. 12, a first bias voltage 1 represents the bias voltage generated by first RF power RF1. There is a first potential difference 1 between the first bias voltage 1 and a first DC voltage DC1. A second bias voltage 2 represents a bias voltage generated by second RF power RF2. There is a second potential difference 2 between the second bias voltage 2 and a second DC voltage DC2. The first potential difference 1 and the second potential difference 2 from the potential of the wafer W may have the same value or different values.

In this case, when the output of the first DC voltage DC1 is greater than the output of the second DC voltage DC2, in order to change the output of the first DC voltage DC1 to the output of the second DC voltage DC2, after the first DC voltage DC1 is output, static elimination is performed such that the first DC voltage DC1 is discharged to be equal to the second DC voltage DC2, and then the second DC voltage DC1 is output. Therefore, depending on the number of power outputs, a static elimination circuit for eliminating a potential difference at the time of switching the two DC voltage outputs may be provided inside or outside the DC power supply 60. This static elimination circuit can also be used as the static elimination circuit 67. The present embodiment can also achieve the effect of waveform control described above for switching between the first DC voltage DC1 and the second DC voltage DC2.

Although the plasma processing apparatus 1 of the above embodiment is a capacitively coupled plasma processing apparatus, the plasma processing apparatus to which the present disclosure is applied is not limited thereto. For example, the plasma processing apparatus may be an inductively coupled plasma processing apparatus.

Further, for example, the present disclosure includes the following embodiments.

(Additional Statement 1)

A plasma processing apparatus for performing plasma processing on a substrate, comprising:

a chamber;

a substrate support disposed in the chamber and including a base, an electrostatic chuck on the base, and an edge ring disposed to surround a substrate mounted on the electrostatic chuck;

a Radio Frequency (RF) power supply for supplying RF power for generating plasma from gases in the chamber;

a DC power supply for applying a negative DC voltage to the edge ring;

a waveform control element for controlling a waveform of the DC voltage; and a controller for controlling a time taken for the DC voltage to reach a desired value by adjusting a constant of the waveform control element.

(Additional Statement 2)

The plasma processing apparatus of additional statement 1, further comprising an RF filter electrically connected to the edge ring, wherein the waveform control element is disposed in the RF filter.

(Additional Statement 3)

The plasma processing apparatus of additional statement 1, wherein the waveform control element is disposed in the DC power supply.

(Additional Statement 4)

The plasma processing apparatus of additional statement 3, wherein the DC power supply includes a pulse generator for generating pulses of the DC voltage, and the waveform control element is disposed on the side of the edge ring rather than the pulse generator.

(Additional Statement 5)

The plasma processing apparatus of additional statement 1, further comprising:

a DC power circuit for applying the DC voltage to the edge ring;

a static elimination circuit for performing static elimination on the edge ring; and a switching unit for switching between a connection of the edge ring and the DC power supply circuit and a connection of the edge ring and the static elimination circuit, wherein the waveform control element is disposed in the switching unit.

(Additional Statement 6)

The plasma processing apparatus of additional statement 2, wherein the waveform control element is disposed in a path between the DC power supply and the RF filter.

(Additional Statement 7)

The plasma processing apparatus of any one of additional statements 1 to 6, wherein a hot-side path connecting the DC power supply and the edge ring, and a return-side path connecting the edge ring to a ground are provided, and the waveform control element includes one or more of a capacitive element, an inductive element, a resistive element, an electromagnetic energy converter, and a transmission line disposed in the hot-side path or between the hot-side path and the return-side path.

(Additional Statement 8)

The plasma processing apparatus of any one of additional statements 1 to 7, further comprising a non-waveform control element having a function other than a function of controlling the waveform of the DC voltage, wherein the other function includes at least one function selected from a group consisting of a capacitive element, an inductive element, a resistive element, an electromagnetic energy converter, and a transmission line.

(Additional Statement 9)

The plasma processing apparatus of any one of additional statements 1 to 8, wherein the waveform control element has a function other than the function of controlling the waveform of the DC voltage, wherein the other function includes at least one function selected from a group consisting of a capacitive element, an inductive element, a resistive element, an electromagnetic energy converter, and a transmission line.

(Additional Statement 10)

The plasma processing apparatus of additional statement 8, wherein the non-waveform control element includes a variable element for making an impedance of the RF filter variable.

(Additional Statement 11)

The plasma processing apparatus of any one of additional statements 1 to 9, wherein a constant of the waveform control element is changeable.

(Additional Statement 12)

The plasma processing apparatus of any one of additional statements 1 to 9, wherein the constant of the waveform control element is a fixed value, a plurality of waveform control elements having different constants are provided, the plasma processing apparatus further comprises a switching circuit for switching between the plurality of waveform control elements.

(Additional Statement 13)

The plasma processing apparatus of any one of additional statements 1 to 12, wherein the controller controls the waveform of the DC voltage by adjusting the constant of the waveform control element such that the DC voltage becomes close to a bias voltage.

(Additional Statement 14)

The plasma processing apparatus of any one of additional statements 1 to 12, wherein the controller controls the apparatus such that the apparatus executes processing including (a) a process of starting supply of the RF power and starting application of the DC voltage after a predetermined dead time has elapsed, and (b) a process of controlling the waveform of the DC voltage by adjusting the constant of the waveform control element and controlling a time taken for the DC voltage to reach a desired value.

(Additional Statement 15)

The plasma processing apparatus of additional statement 14, wherein the controller controls the apparatus such that the apparatus executes processing including (c) a process of stopping supply of the RF power and starting static elimination of the edge ring after a predetermined dead time has elapsed, and (d) a process of controlling the waveform of the DC voltage by adjusting the constant of the waveform control element and controlling a time taken for the DC voltage to reach a desired value.

(Additional Statement 16)

The plasma processing apparatus of additional statement 14 or 15, wherein the controller determines a corresponding dead time based on a ratio of the dead time to an application time of the DC voltage.

(Additional Statement 17)

The plasma processing apparatus of additional statement 16, wherein the controller measures a reflection time after the RF power is supplied and determines a time equal to or longer than the reflection time as the dead time.

(Additional Statement 18)

The plasma processing apparatus of additional statement 16 or 17, wherein the controller measures a potential of the edge ring and determines the dead time based on the potential of the edge ring.

(Additional Statement 19)

A plasma processing method for performing plasma processing on a substrate using a plasma processing apparatus, the plasma processing apparatus comprising:

a chamber;

a substrate support disposed in the chamber and including a base, an electrostatic chuck on the base, and an edge ring disposed to surround a substrate mounted on the electrostatic chuck;

an RF power supply for supplying RF power for generating plasma from gases in the chamber;

a DC power supply for applying a negative DC voltage to the edge ring;

an RF filter electrically connected to the edge ring; and a waveform control element for controlling a waveform of the DC voltage, the plasma processing method comprising controlling a time taken for the DC voltage to reach a desired value by adjusting a constant of the waveform control element.

It should be considered that the embodiments disclosed this time are illustrative in all respects and not restrictive. The embodiments described above may be omitted, substituted, or modified in various ways without departing from the scope and spirit of the appended claims.

The invention claimed is:

1. A plasma processing apparatus configured to perform plasma processing on a substrate, comprising:
   a chamber;
   a substrate support disposed in the chamber and including a base, an electrostatic chuck on the base, and an edge ring disposed to surround a substrate mounted on the electrostatic chuck;
   a Radio Frequency (RF) power supply configured to supply RF power to the chamber so as to generate plasma from gases in the chamber;
   a DC power supply configured to apply a negative DC voltage to the edge ring;
   at least one waveform control element configured to control the application of the negative DC voltage by the DC power supply; and
   a controller configured to control the RF power supply and a control parameter of the at least one waveform control element in a coordinated manner so as to control a time taken for the negative DC voltage to reach a desired value.

2. The plasma processing apparatus of claim 1, further comprising an RF filter electrically connected to the edge ring,
   wherein the at least one waveform control element is disposed in the RF filter.

3. The plasma processing apparatus of claim 2, wherein the at least one waveform control element is disposed in a path between the DC power supply and the RF filter.

4. The plasma processing apparatus of claim 1, wherein the at least one waveform control element is disposed in the DC power supply.

5. The plasma processing apparatus of claim 4, wherein the DC power supply includes a pulse generator configured to generate pulses of the negative DC voltage, and the at least one waveform control element is disposed on a side of the edge ring.

6. The plasma processing apparatus of claim 1, further comprising:
   a DC power circuit configured to apply the negative DC voltage to the edge ring;
   a static elimination circuit configured to perform static elimination on the edge ring; and
   a switching unit configured to switch between a connection between the edge ring and the DC power supply circuit and a connection between the edge ring and the static elimination circuit,
   wherein the at least one waveform control element is disposed in the switching unit.

7. The plasma processing apparatus of claim 1, further comprising:
   a hot-side path connecting the DC power supply and the edge ring, and a return-side path connecting the edge ring to a ground,
   wherein the at least one waveform control element includes one or more of a capacitive element, an inductive element, a resistive element, an electromagnetic energy converter, and a transmission line disposed in the hot-side path or between the hot-side path and the return-side path, and
   wherein the control parameter of the at least one waveform control element is a control parameter of the one or more of the capacitive element, the inductive element, the resistive element, the electromagnetic energy converter, and the transmission line.

8. The plasma processing apparatus of claim 1, further comprising:
   a non-waveform control element having a function other than a function of controlling the control parameter of the negative DC voltage,
   wherein the other function includes at least one function selected from a group consisting of a capacitive element, an inductive element, a resistive element, an electromagnetic energy converter, and a transmission line.

9. The plasma processing apparatus of claim 8, wherein the non-waveform control element includes a variable element configured to make an impedance of the RF filter variable.

10. The plasma processing apparatus of claim 1, wherein the at least one waveform control element has a function other than controlling the control parameter of the negative DC voltage,
    wherein the other function includes at least one function selected from a group consisting of:
    operating as a capacitive element,
    operating as an inductive element,
    operating as a resistive element,
    operating as an electromagnetic energy converter, and
    operating as a transmission line.

11. The plasma processing apparatus of claim 1, wherein the control parameter of the waveform control element is a changeable control parameter or is a fixed control parameter.

12. The plasma processing apparatus of claim 1, wherein;
    the at least one waveform control element comprises a plurality of waveform control elements each having corresponding control parameters,
    the plasma processing apparatus further comprises a switching circuit configured to switch between the plurality of waveform control elements, and
    the controller is further configured to control the switching circuit to switch between the plurality of waveform control elements so as to control the time taken for the negative DC voltage to reach the desired value.

13. The plasma processing apparatus of claim 1, wherein the controller controls the control parameter of the negative DC voltage by adjusting the control parameter of the at least one waveform control element such that the negative DC voltage controllably approaches the bias voltage generated by the RF power supply.

14. The plasma processing apparatus of claim 1,
    wherein the time taken for the negative DC voltage to reach the desired value comprises a first time taken for the negative DC voltage to reach a first desired value, and
    wherein the controller:
    (a) controls the RF power supply to start supplying the RF power for a first time period, and
    (b) after a first predetermined dead time period, which occurs after the first time period, has elapsed:
    (b1) controls the DC power supply to start of the application of the negative DC voltage, and
    (b2) controls the first time taken for the negative DC voltage to reach the first desired value by adjusting the control parameter of the at least one waveform control element after the first predetermined dead time has elapsed.

15. The plasma processing apparatus of claim 14,
    wherein the time taken for the negative DC voltage to reach the desired value comprises a second time taken for the negative DC voltage to reach a second desired value, and wherein the controller:
(c) at a time after the DC power supply has started the application of the negative DC voltage:
(c1) controls the RF power supply to stop supplying the RF power,
(c2) controls the DC power supply to stop the application of the negative DC voltage, and
(c3) begins to control the second time taken for the negative DC voltage to reach the second desired value by adjusting the control parameter of the at least one waveform control element, and
(d) after a second predetermined dead time period, which occurs after the RF power supply stops supplying the RF power, has elapsed:
(d1) starts a static elimination of the edge ring, and
(d2) continues to control the second time taken for the negative DC voltage to reach the second desired value by adjusting the control parameter of the at least one waveform control element.

16. The plasma processing apparatus of claim 14, wherein the controller determines the first dead time based on a ratio of the first dead time to a time that the DC power supply starts the application of the negative DC voltage.

17. The plasma processing apparatus of claim 16, wherein the controller measures a reflection time after the RF power supply starts supplying the RF power and determines a time equal to or longer than the reflection time as the first predetermined dead time.

18. The plasma processing apparatus of claim 16, wherein the controller measures a potential of the edge ring and determines the first predetermined dead time based on the potential of the edge ring.

19. A plasma processing method configured to perform plasma processing on a substrate using a plasma processing apparatus,
the plasma processing apparatus comprising:
a chamber;
a substrate support disposed in the chamber and including a base, an electrostatic chuck on the base, and an edge ring disposed to surround a substrate mounted on the electrostatic chuck;
a Radio Frequency (RF) power supply configured to supply RF power to the chamber so as to generate plasma from gases in the chamber;
a DC power supply configured to apply a negative DC voltage to the edge ring;
at least one waveform control element configured to control the application of the negative DC voltage by the DC power supply; and
a controller configured to control the RF power supply and the at least one waveform control element,
the plasma processing method comprising:
controlling the RF power supply and a control parameter of the at least one waveform control element in a coordinated manner so as to control a time taken for the negative DC voltage to reach a desired value.

* * * * *